(12) United States Patent
Miyamoto

(10) Patent No.: US 7,733,681 B2
(45) Date of Patent: Jun. 8, 2010

(54) FERROELECTRIC MEMORY WITH AMPLIFICATION BETWEEN SUB BIT-LINE AND MAIN BIT-LINE

(76) Inventor: Hideaki Miyamoto, 310-20, Arakawa-cho, Ogaki-shi, Gifu (JP) 503-0993

( * ) Notice: Subject to any disclaimer, the term of this patent is extended or adjusted under 35 U.S.C. 154(b) by 30 days.

(21) Appl. No.: 11/739,336

(22) Filed: Apr. 24, 2007

(65) Prior Publication Data
US 2007/0253273 A1 Nov. 1, 2007

(30) Foreign Application Priority Data

Apr. 26, 2006 (JP) ............................. 2006-121398
Jun. 16, 2006 (JP) ............................. 2006-166768
Sep. 20, 2006 (JP) ............................. 2006-254118

(51) Int. Cl.
*G11C 5/06* (2006.01)
(52) U.S. Cl. ...................... 365/65; 365/49.12; 365/117; 365/145; 365/230.03; 365/189.15; 365/189.06; 365/205; 365/207
(58) Field of Classification Search ............. 365/49.12, 365/65, 117, 145, 203.03, 189.15, 189.06, 365/205, 207
See application file for complete search history.

(56) References Cited

U.S. PATENT DOCUMENTS

| | | | |
|---|---|---|---|
| 2003/0086312 A1* | 5/2003 | Kang | 365/200 |
| 2005/0141258 A1* | 6/2005 | Kang et al. | 365/145 |
| 2005/0207203 A1* | 9/2005 | Kang | 365/145 |
| 2005/0213419 A1* | 9/2005 | Miyamoto | 365/230.03 |

FOREIGN PATENT DOCUMENTS

| | | |
|---|---|---|
| JP | 07-073682 | 3/1995 |
| JP | 2001-229674 | 8/2001 |
| JP | 2003-123466 | 4/2003 |

* cited by examiner

*Primary Examiner*—Hoai V Ho
*Assistant Examiner*—Fernando N Hidalgo
(74) *Attorney, Agent, or Firm*—Schwabe, Williamson & Wyatt P.C.

(57) ABSTRACT

A memory capable of suppressing increase of the chip area thereof while increasing a read voltage is obtained. This memory comprises a memory cell array including a plurality of subarrays, a sub bit line arranged on each subarray and provided to be connectable to a main bit line, a storage portion connected between the word line and the sub bit line and a first transistor having a gate connected to the sub bit line and a first source/drain region connected to the main bit line for controlling the potential of the main bit line on the basis of the potential of the sub bit line in a read operation.

19 Claims, 7 Drawing Sheets

FERROELECTRIC MEMORY WITH AMPLIFICATION BETWEEN SUB BIT-LINE AND MAIN BIT-LINE

CROSS-REFERENCE TO RELATED APPLICATIONS

The priority application numbers JP2006-121398, Memory, Apr. 26, 2006, Hideaki Miyamoto, JP2006-166768, Memory, Jun. 16, 2006, Hideaki Miyamoto and JP2006-254118, Sep. 20, 2006, Hideaki Miyamoto, upon which this patent application is based are hereby incorporated by reference.

BACKGROUND OF THE INVENTION

1. Field of the Invention

The present invention relates to a memory.

2. Description of the Background Art

A ferroelectric memory comprising memory cells including ferroelectric capacitors is generally known as one of nonvolatile memories. Such ferroelectric memories include a one-transistor one-capacitor ferroelectric memory comprising memory cells each formed by one transistor and one ferroelectric capacitor, a one-transistor ferroelectric memory comprising memory cells each formed by one transistor having a ferroelectric capacitor and a simple matrix ferroelectric memory comprising memory cells each formed by only a ferroelectric capacitor arranged between a word line and a bit line. Each of the one-transistor ferroelectric memory and the simple matrix ferroelectric memory is constituted of a smaller number of elements as compared with the one-transistor one-capacitor ferroelectric memory, whereby the area per memory cell is reduced. Therefore, the chip area of the overall memory cell array can be reduced.

The one-transistor one-capacitor ferroelectric memory controls connection between bit lines and the ferroelectric capacitors through the transistors. Therefore, the parasitic capacitance of each bit line is decided by the sum of the wiring capacitance thereof and the diffusion capacitance (junction capacitance) of the corresponding transistor. In the simple matrix ferroelectric memory, on the other hand, each ferroelectric capacitor is directly connected to the corresponding bit line, whereby the parasitic capacitance of the bit line is the sum of the wiring capacitance thereof and the capacitance of the ferroelectric capacitor. The dielectric constant of the ferroelectric capacitor is so high that the capacitance of the ferroelectric capacitor is greater than the diffusion capacitance (junction capacitance) of a transistor with respect to the same area. Therefore, the bit line parasitic capacitance in the simple matrix ferroelectric memory is greater than that in the one-transistor one-capacitor ferroelectric memory. Further, a read voltage output to the bit line in a read operation depends on the ratio (Cs/Cb) between a cell capacitance Cs and a bit line parasitic capacitance Cb. Therefore, the read voltage can be increased as the ratio Cs/Cb is increased. In other words, the read voltage can be more increased as the bit line parasitic capacitance Cb is reduced. However, the bit line parasitic capacitance in the simple matrix ferroelectric memory is greater than that in the one-transistor one-capacitor ferroelectric memory as hereinabove described, and hence the read voltage is disadvantageously reduced in the simple matrix ferroelectric memory.

Therefore, generally proposed is a bit line hierarchical structure of bit lines divided into a main bit line and sub bit lines. A ferroelectric nonvolatile semiconductor memory having such a bit line hierarchical structure comprises bit lines divided into a main bit line and sub bit lines, a read transistor controlling the potential of the main bit line on the basis of the potential of a selected sub bit line in a read operation and a detection transistor.

In this conventional ferroelectric nonvolatile semiconductor memory, the sub bit lines are connected to the gate of the detection transistor. The main bit line is connected to a first source/drain region of the detection transistor through the read transistor. A second source/drain region of the detection transistor is connected to a power supply potential (Vcc). The conventional ferroelectric nonvolatile semiconductor memory controls ON- and OFF-states of the detection transistor through a potential corresponding to data appearing on the selected sub bit line in the read operation and applies the power supply potential (Vcc) to the main bit line through two transistors, i.e. the detection transistor and the read transistor only when the detection transistor is in an ON-state, thereby controlling the potential output to the main bit line in response to the data.

In this conventional ferroelectric nonvolatile semiconductor memory, a capacitance contributing to a bit line parasitic capacitance is limited to the capacitance of memory cells connected to the divided sub bit lines. Thus, the value of a parasitic capacitance Cb of the overall bit lines is so reduced that a read voltage can be increased.

However, the conventional ferroelectric nonvolatile semiconductor memory must be provided with the two transistors, i.e. the read transistor and the detection transistor in order to control the potential of the main bit line on the basis of the potential of the selected sub bit line in the read operation, and hence the chip area of the memory is disadvantageously increased.

SUMMARY OF THE INVENTION

A memory according to an aspect of the present invention comprises a memory cell array including a plurality of subarrays, a word line arranged on the memory cell array, a main bit line arranged to intersect with the word line, a sub bit line arranged on each subarray and provided to be connectable to the main bit line, a storage portion connected between the word line and the sub bit line and a first transistor having a gate connected to the sub bit line and a first source/drain region connected to the main bit line for controlling the potential of the main bit line on the basis of the potential of the sub bit line in a read operation.

DESCRIPTION OF THE PREFERRED EMBODIMENTS

Embodiments of the present invention are now described with reference to the drawings.

First Embodiment

The structure of a ferroelectric memory according to a first embodiment of the present invention is described with reference to FIGS. 1 to 3. The first embodiment of the present invention is applied to a simple matrix ferroelectric memory, which is an exemplary memory.

Figure 1:
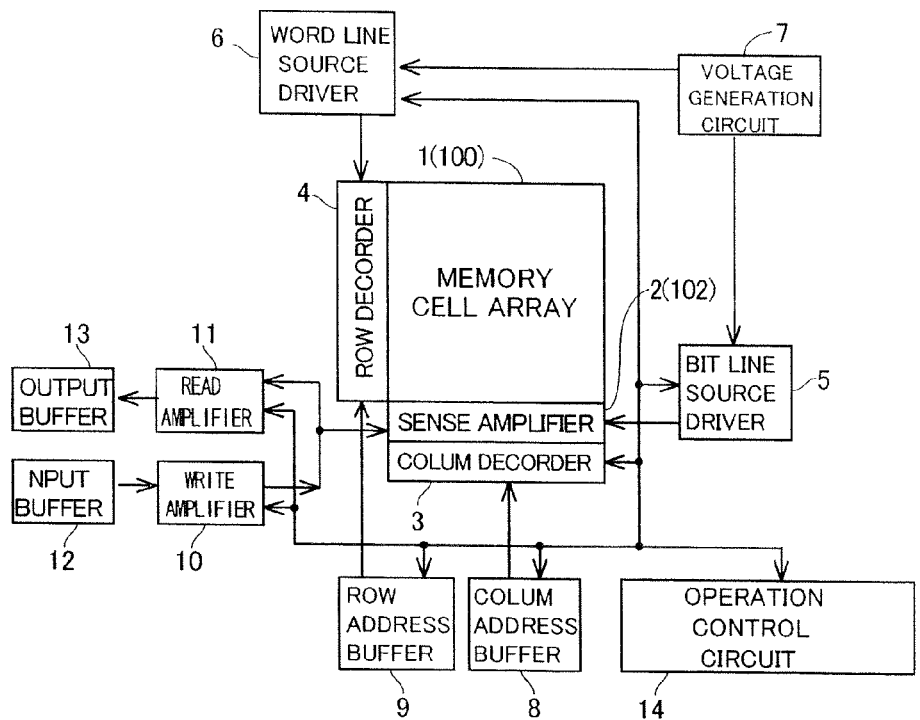
FIG. 1 is a block diagram for illustrating the overall structure of a simple matrix ferroelectric memory according to a first embodiment of the present invention.

The simple matrix ferroelectric memory according to the first embodiment comprises a memory cell array 1, a sense amplifier 2, a column decoder 3, a row decoder 4, a bit line source driver 5, a word line source driver 6, a voltage generation circuit 7, a column address buffer 8, a row address buffer 9, a write amplifier 10, a read amplifier 11, an input buffer 12, an output buffer 13 and an operation control circuit 14, as shown in FIG. 1.

The bit line source driver 5 and the word line source driver 6 are connected to the sense amplifier 2 and the row decoder 4 respectively. Further, the bit line source driver 5 and the word line source driver 6 are supplied with signals having prescribed potentials generated in the voltage generation circuit 7 respectively. The column address buffer 8 and the row address buffer 9 are connected to the column decoder 3 and the row decoder 4 respectively. The write amplifier 10 and the read amplifier 11 are connected to the sense amplifier 2, while the input buffer 12 and the output buffer 13 are connected to the write amplifier 10 and the read amplifier 11 respectively. The operation control circuit 14 is connected to the column decoder 3, the bit line source driver 5, the word line source driver 6, the column address buffer 8, the row address buffer 9, the write amplifier 10 and the read amplifier 11.

Figure 2:
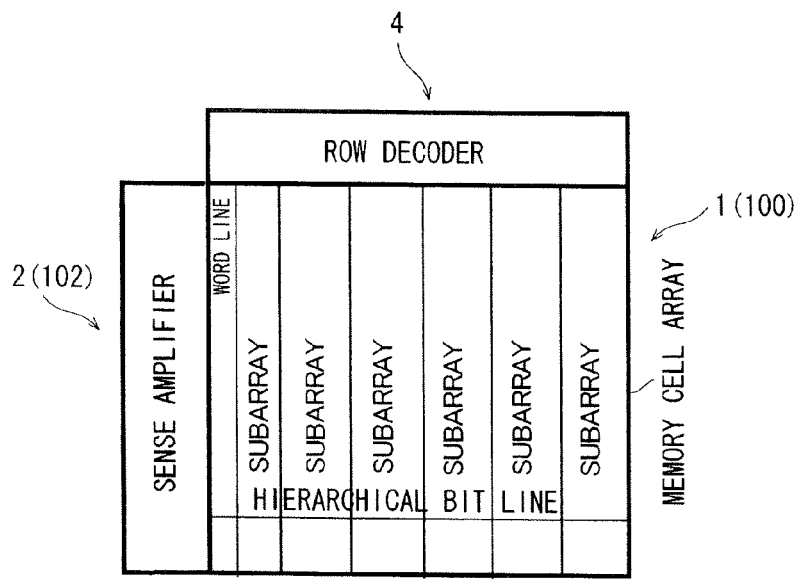
FIG. 2 is a schematic diagram showing the structure of a memory cell array of the ferroelectric memory according to the first embodiment shown in FIG. 1.

The memory cell array 1 is divided into six subarrays, as shown in FIG. 2. A plurality of (e.g. 256) word lines WL and a plurality of hierarchical bit lines are arranged on each of the respective subarrays to intersect with each other. The hierarchical bit lines are formed by a common main bit line and sub bit lines arranged for the respective subarrays. The main bit line included in the hierarchical bit lines is connected to the column decoder 3 through the sense amplifier 2, while the word lines WL are connected to the row decoder 4.

The plurality of (e.g. 256) word lines WL are arranged on each of the subarrays to intersect with the sub bit lines respectively. Ferroelectric capacitors 33 are connected to the regions where the sub bit lines and the word lines WL intersect with each other respectively. Thus, the simple matrix ferroelectric memory has memory cells each constituted of one ferroelectric capacitor 33. The ferroelectric capacitors 33 are examples of the "storage portion" in the present invention.

Figure 3:
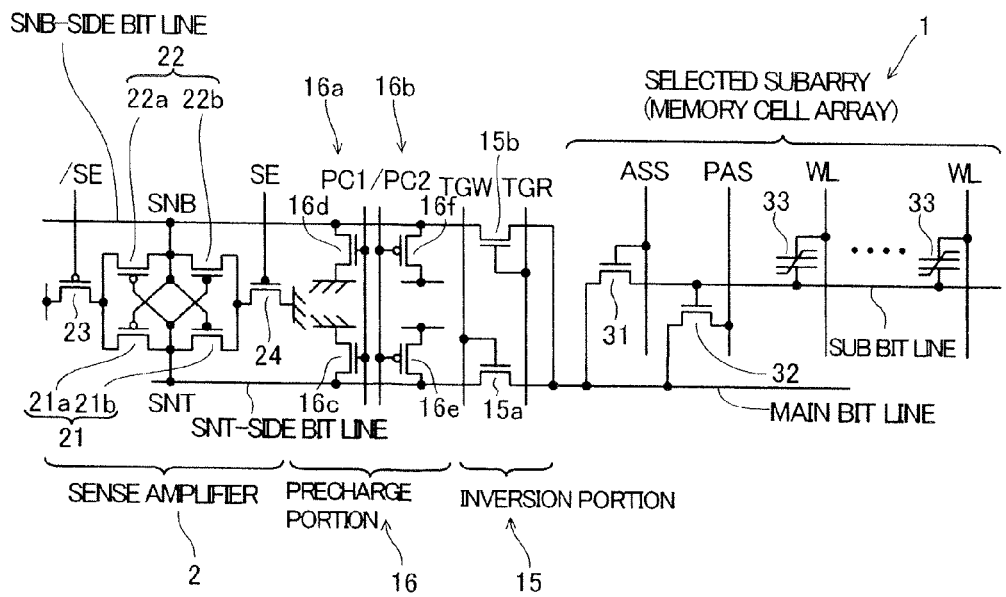
FIG. 3 is a circuit diagram detailedly showing the internal structures of a sense amplifier and a subarray adjacent to the sense amplifier in the ferroelectric memory according to the first embodiment shown in FIG. 1.

According to the first embodiment, an inversion portion 15, a precharge portion 16 and the sense amplifier 2 are sequentially connected to the memory cell array 1, as shown in FIG. 3. The sub bit lines are arranged on the subarrays of the memory cell array 1. Each sub bit line is provided with a transfer gate transistor 31 formed by an n-channel transistor for connecting the corresponding sub bit line and the main bit line with each other and a potential amplification transistor 32 formed by an n-channel transistor for controlling the potential of the main bit line on the basis of the potential of the corresponding sub bit line.

The transfer gate transistor 31 has a first source/drain region connected to the main bit line and a second source/drain region connected to the corresponding sub bit line. A signal line ASS is connected to the gate of the transfer gate transistor 31. This transfer gate transistor 31 enters an ON-state in a rewrite operation, and enters an OFF-state in a read operation. The transfer gate transistor 31 is an example of the "second transistor" in the present invention.

According to the first embodiment, the potential amplification transistor 32 has a first source/drain region connected to the main bit line, a second source/drain region connected to a signal line PAS and a gate connected to the corresponding sub bit line. The second source/drain region of the transfer gate transistor 31 is connected to the gate of the potential amplification transistor 31 through the corresponding sub bit line. The threshold voltage of the potential amplification transistor 32 is set to such a level (about 0.1 V, for example) that the potential amplification transistor 32 enters an ON-state through a potential (about 0.15 V) appearing on the corresponding sub bit line when high-level data is written in the corresponding ferroelectric capacitor 33 and enters an OFF-state through a potential (about 0.05 V) appearing on the corresponding sub bit line when low-level data is written in the ferroelectric capacitor 33. The potential amplification transistor 32 is an example of the "first transistor" in the present invention. The high- and low-level data are examples of the "first data" and the "second data" in the present invention respectively.

The inversion portion 15 includes an n-channel transistor 15a for connecting the main bit line and an SNT-side bit line with each other and another n-channel transistor 15b for connecting the main bit line and an SNB-side bit line with each other. The n-channel transistor 15a has a first source/drain region connected to the SNT-side bit line, a second source/drain region connected to the main bit line and a gate connected to a signal line TGW. The n-channel transistor 15b has a first source/drain region connected to the SNB-side bit line, a second source/drain region connected to the main bit line an a gate connected to another signal line TGR.

The precharge portion 16 includes a precharge portion 16a for precharging the bit lines to the ground potential and another precharge portion 16b for precharging the bit lines to a power supply potential (Vcc). The precharge portion 16a is constituted of an n-channel transistor 16c connected between the SNT-side bit line and the ground potential and another n-channel transistor 16d connected between the SNB-side bit line and the ground potential. A signal line PC1 is connected to the gates of the n-channel transistors 16c and 16d. The precharge portion 16b is constituted of a p-channel transistor 16e connected between the SNT-side bit line and the power supply potential (Vcc) and another p-channel transistor 16f connected between the SNB-side bit line and the power supply potential (Vcc). Another signal line /PC2 is connected to the gates of the p-channel transistors 16e and 16f.

The sense amplifier 2 is formed by cross-coupling inputs and outputs of two CMOS inverter circuits 21 and 22 with each other. The CMOS inverter circuit 21 is constituted of a p-channel transistor 21a and an n-channel transistor 21b, while the CMOS inverter circuit 22 is constituted of a p-channel transistor 22a and an n-channel transistor 22b. The power supply potential (Vcc) is connected to first source/drain regions of the p-channel transistors 21a and 22a through a p-channel transistor 23. First source/drain regions of the n-channel transistors 21b and 22b are grounded through an n-channel transistor 24. Signal lines /SE and SE are connected to the gates of the p-channel transistor 23 and the n-channel transistor 24 respectively. The gates of the p-channel transistor 21a and the n-channel transistor 21b are connected to a node SNB, while the gates of the p-channel transistor 22a and the n-channel transistor 22b are connected to another node SNT. The SNB-side bit line is connected to the node SNB, while the SNT-side bit line is connected to the node SNT.

A standby time, a setup for a read operation, the read operation and a rewrite operation in the ferroelectric memory according to the first embodiment are now described with reference to FIGS. 1 to 4. In the following description, it is assumed that the subarray adjacent to the sense amplifier 2 is selected from among the six subarrays.

(Standby Time)

Figure 4:
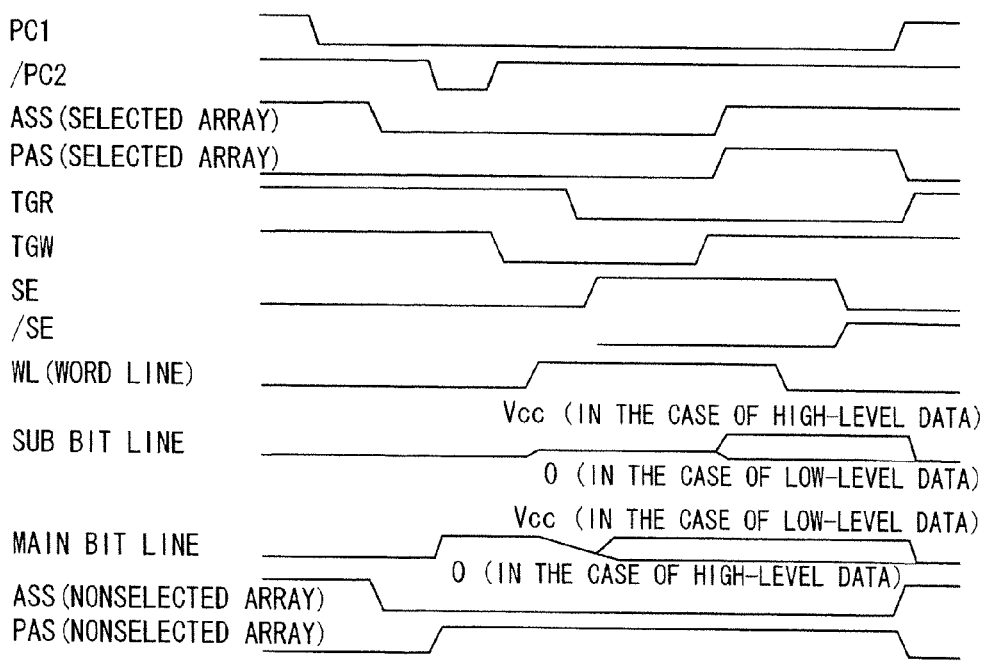
FIG. 4 is a timing chart for illustrating operations of the ferroelectric memory according to the first embodiment of the present invention.

In the standby time, all of the signal line ASS of the selected subarray and signal lines ASS (not shown) of the nonselected subarrays are held at a step-up potential Vcc+α (α>threshold voltage Vth of transfer gate transistor 31), as shown in FIG. 4. The step-up potential Vcc+α is applied to the signal lines ASS, in order to prevent a threshold voltage drop (potential reduction by the threshold voltage Vth) resulting from the transfer gate transistor 31 in the rewrite operation described later. Thus, the transfer gate transistors 31 connecting the sub bit lines and the main bit line with each other enter ON-states, thereby connecting the sub bit lines and the main bit line with each other.

The signal lines TGR and TGW are also held at the step-up potential Vcc+α (α>threshold voltage Vth of n-channel transistors 15a and 15b). Thus, the SNB-side bit line and the main bit line are connected with each other, while the SNT-side bit line and the main bit line are also connected with each other.

On the other hand, the signal lines PC1 and /PC2 are held at Vcc. Thus, the n-channel transistors 16c and 16d of the precharge portion 16 enter ON-states while the p-channel transistors 16e and 16f enter OFF-states, thereby precharging the SNT-side bit line, the SNB-side bit line, the main bit line and the sub bit lines to the ground potential (0 V).

(Setup for Read Operation)

When the ferroelectric memory is accessed, the potential of the signal line PC1 is stepped down from Vcc to 0 V, while the potentials of the signal line ASS of the selected subarray and the signal lines ASS (not shown) of the nonselected subarrays are also stepped down from Vcc to 0 V. Thus, the transfer gate transistors 31 enter OFF-states, thereby cutting off all sub bit lines from the main bit line. Therefore, all sub bit lines are electrically separated from the main bit line. Thus, the sub bit lines enter floating states at 0 V.

Then, the potential of the signal line /PC2 is stepped down from Vcc to 0 V. Thus, the p-channel transistors 16e and 16f enter OFF-states, thereby precharging the main bit line from 0 V to Vcc through the SNT-side bit line and the SNB-side bit line. After the main bit line is sufficiently precharged to Vcc, the potential of the signal line /PC2 is stepped up from 0 V to Vcc. Then, the potential of the signal line TGW is stepped down from Vcc to 0 V. Thus, the n-channel transistor 15a enters an OFF-state, thereby electrically separating the SNT-side bit line and the main bit line from each other. Therefore, the main bit line enters a floating state at Vcc (about 1.8 V). A reference potential generated in a reference potential generation circuit (not shown) is applied to the SNT-side bit line, whereby the node SNT of the sense amplifier 2 reaches the reference potential. The reference potential is set to an intermediate level (about 1.55 V, for example) between a potential (about 1.8 V) output to the main bit line in an operation of reading low-level data described later and a potential (about 1.3 V) output to the main bit line in an operation of reading high-level data.

(Read Operation)

In the read operation, the potential of a selected word line WL of the selected subarray is stepped up from 0 V to Vcc. Thus, a potential (read voltage) corresponding to data (low- or high-level data) written in the corresponding ferroelectric capacitor 33 appears on the sub bit line of the selected subarray. More specifically, a potential of about 0.05 V appears on the sub bit line if low-level data is written in the corresponding ferroelectric capacitor 33 while a potential of about 0.15 V appears on the sub bit line if high-level data is written in the ferroelectric capacitor 33, for example.

The threshold voltage of the potential amplification transistor 32 formed by an n-channel transistor is set to about 0.1 V, as hereinabove described. The potential of the signal line PAS is 0 V at this time, whereby source-to-gate potential difference Vgs of the potential amplification transistor 32 is about 0.05 V if the potential of about 0.05 V corresponding to low-level data appears on the sub bit line. Therefore, the potential amplification transistor 32 remains in an OFF-state, thereby maintaining the potential of the main bit line at Vcc (about 1.8 V). If the potential of about 0.15 V corresponding to high-level data appears on the sub bit line, on the other hand, the source-to-gate potential difference Vgs of the potential amplification transistor 32 is about 0.15 V. Therefore, the potential amplification transistor 32 enters an ON-state, whereby the potential of the main bit line is pulled by the potential (0 V) of the signal line PAS and reduced to about 1.3 V. In other words, the difference (about 0.5 V) between the potential (about 1.8 V) of the main bit line in the case of reading low-level data and the potential (about 1.3 V) of the main bit line in the case of reading high-level data is greater than the difference (about 0.1 V) between the potential (about 0.05 V) of the sub bit line in the case of reading low-level data and the potential (about 0.15 V) of the sub bit line in the case of reading high-level data according to the first embodiment, whereby this can be regarded as amplification of potential difference. According to the first embodiment, however, the potential (about 1.3 V) appearing on the main bit line in the case of reading high-level data is lower than that (about 1.8 V) in the case of reading low-level data, whereby the data of the main bit line is reverse to the data of the sub bit line.

When the read voltage transmitted to the main bit line is further transmitted to the node SNB of the sense amplifier 2 through the SNB-side bit line, the potential of the signal line TGR is stepped down from Vcc to 0 V. Thus, the n-channel transistor 15*b* enters an OFF-state, thereby electrically separating the SNB-side bit line and the main bit line from each other. Further, the potential of the signal line SE is stepped up from 0 V to Vcc, while the potential of the signal line /SE is stepped down from Vcc to 0 V. Thus, the p-channel transistor 23 of the sense amplifier 2 enters an ON-state, thereby supplying the voltage Vcc. The n-channel transistor 24 also enters an ON-state, thereby supplying the ground potential (0 V). Thus, the sense amplifier 2 is activated. The potential of the node SNB to which the potential (about 1.8 V or about 1.3 V) of the main bit line is transmitted and the potential of the node SNT to which the reference potential (about 1.55 V) is transmitted are differentially amplified, and data is read from the selected ferroelectric capacitor 33. According to the first embodiment, the gates of the p-channel transistor 21*a* and the n-channel transistor 21*b* are connected to the reversed-polarity node SNB of the sense amplifier 2 in the read operation, so that the data of the main bit line is reversed to the data of the sense amplifier 2. Thus, the sense amplifier 2 can read the same data as that (data having been written in the memory cell formed by the selected ferroelectric capacitor 33) of the sub bit line also when the data of the main bit line is reversed to the data of the sub bit line.

More specifically, the potentials of the nodes SNT and SNB are about 1.55 V and about 1.8 V respectively in the case of reading low-level data, for example, whereby the nodes SNT and SNB exhibit potentials of 0 V and Vcc respectively after amplification in the sense amplifier 2. In the case of reading high-level data, on the other hand, the potentials of the nodes SNT and SNB are about 1.55 V and about 1.3 V respectively, whereby the nodes SNT and SNB exhibit potentials of Vcc and 0 V respectively after amplification in the sense amplifier 2.

(Rewriting of Read Data)

Thereafter the read data is rewritten in the memory cell formed by the selected ferroelectric capacitor 33. First, the potential of the signal line TGW is stepped up from 0 V to the step-up potential Vcc+α. Thus, the n-channel transistor 15*a* enters an ON-state, thereby electrically connecting the SNT-side bit line and the main bit line with each other. Then, the potential of the signal line ASS of the selected subarray is stepped up from 0 V to the step-up potential Vcc+α. Thus, the transfer gate transistor 31 enters an ON-state, thereby electrically connecting the main bit line and the selected sub bit line with each other. Therefore, the potential (rewrite potential) of the node SNT is transmitted to the sub bit line through the main bit line. In the rewrite operation according to the first embodiment, the main bit line is connected to the node SNT of the same polarity side, dissimilarly to the read operation. Thus, the same data as the read data is rewritten in the memory cell formed by the selected ferroelectric capacitor 33 through the corresponding sub bit line.

At this time, the potential of the signal line PAS is stepped up from 0 V to Vcc. Thus, the potential amplification transistor 32 can be inhibited from causing potential difference exceeding the threshold voltage between the source and the gate thereof also when the potential of the corresponding sub bit line connected to the gate of the potential amplification transistor 32 is set to Vcc, to be inhibited from entering an ON-state in the rewrite operation.

In order to rewrite low-level data, 0 V is transmitted from the node SNT to the selected sub bit line while the potential of the selected word line WL is set to Vcc. Thus, the low-level data is rewritten in the selected ferroelectric capacitor 33. Thereafter the potential of the selected word line WL is stepped down from Vcc to 0 V. In order to rewrite high-level data, on the other hand, Vcc is transmitted from the node SNT to the selected sub bit line while the potential of the selected word line WL is set to 0 V. Thus, the high-level data is rewritten in the selected ferroelectric capacitor 33. Thereafter the potential of the signal line SE is stepped down from Vcc to 0 V, while the potential of the signal line /SE is stepped up from 0 V to Vcc. Further, the potential of the signal line PAS is stepped down from Vcc to 0 V, while the potential of the signal line PC1 is stepped up from 0 V to Vcc. In addition, the potential of the signal line TGR is stepped up from 0 V to the step-up potential Vcc+α. Thus, the ferroelectric memory returns to a standby state.

According to the first embodiment, as hereinabove described, the ferroelectric memory, provided with the potential amplification transistors 32 each formed by the n-channel transistor having the gate connected to the corresponding sub bit line and the first source/drain region connected to the main bit line for controlling the potential of the main bit line on the basis of the potential of the corresponding sub bit line in the read operation, can control the potential of the main bit line on the basis of the selected sub bit line with the corresponding potential amplification transistor 32 formed by one n-channel transistor in the read operation, thereby suppressing increase of the number of transistors. Thus, the ferroelectric memory can be inhibited from increase of the chip area. Further, the ferroelectric memory is provided with the main bit line so arranged as to intersect with the word lines WL and the sub bit lines arranged on the subarrays and provided to be connectable to the main bit line so that the bit lines are divided into the main bit line and the sub bit lines, whereby the capacitance contributing to the bit line parasitic capacitance can be limited to that of the ferroelectric capacitors 33 connected to the sub bit lines. Thus, the value of the parasitic capacitance of the overall bit lines can be so reduced that the read voltage can be increased.

According to the first embodiment, each potential amplification transistor 32 is formed to have the threshold voltage (about 0.1 V) for entering an ON-state when high-level data is read and entering an OFF-state when low-level data is read so that the potential amplification transistor 32 can be switched between the ON-state and the OFF-state in response to the potential of the corresponding sub bit line input in the gate thereof in the read operation, whereby the potential of the main bit line can be easily controlled through the first source/drain region of the potential amplification transistor 32 connected to the main bit line. Thus, high- or low-level data written in the selected ferroelectric capacitor 33 can be easily read by detecting the potential of the main bit line.

According to the first embodiment, the ferroelectric memory is provided with the signal line PAS connected to the second source/drain of each potential amplification transistor 32 and so formed as to bring the main bit line into a floating state at Vcc (about 1.8 V) while holding the signal line PAS at 0 V in the read operation, whereby the potential amplification transistor 32 enters an ON-state for connecting the main bit line and the signal line PAS with each other so that the potential of the main bit line is pulled by the potential of the signal line PAS and reduced to about 1.3 V when the potential (about 0.15 V) corresponding to high-level data appears on the corresponding sub bit line. When the potential (about 0.05 V) corresponding to low-level data appears on the corresponding sub bit line, on the other hand, the potential amplification transistor 32 remains in an OFF-state, thereby maintaining the potential of the main bit line at Vcc (about 1.8 V).

Thus, the potential difference of about 0.1 V appearing on the sub bit line can be amplified to about 0.5 V and transmitted to the main bit line.

According to the first embodiment, the potential of the signal line PAS is so stepped up from 0 V to Vcc in the rewrite operation that the potential amplification transistor 32 can be inhibited from entering an ON-state in the rewrite operation. Thus, the main bit line and the signal line PAS can be inhibited from electrical connection, whereby the potential of the main bit line can be inhibited from reduction resulting from the potential of the signal line PAS.

According to the first embodiment, the ferroelectric memory, provided with the transfer gate transistors 31 each formed by the n-channel transistor having the second source/drain line connected to the corresponding sub bit line and the first source/drain region connected to the main bit line, can electrically connect the main bit line and the selected sub bit line with each other for writing data in the rewrite operation by turning off the corresponding transfer gate transistor 31 in the read operation and turning on the same in the rewrite operation.

Second Embodiment

Figure 5:
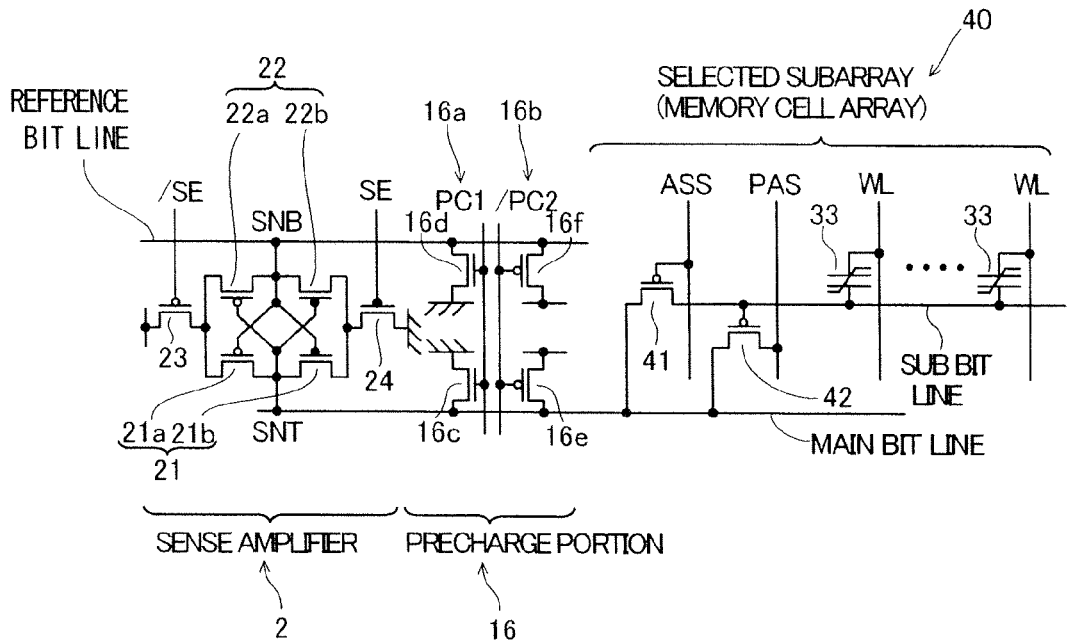
FIG. 5 is a circuit diagram detailedly showing the internal structures of a sense amplifier and a subarray adjacent to the sense amplifier in a ferroelectric memory according to a second embodiment of the present invention.

Referring to FIG. 5, transfer gate transistors 41 and potential amplification transistors 42 are formed by p-channel transistors in a ferroelectric memory according to a second embodiment of the present invention, dissimilarly to the aforementioned first embodiment.

According to the second embodiment, a precharge portion 16 and a sense amplifier 2 are sequentially connected to a memory cell array 40, as shown in FIG. 5. Sub bit lines are arranged on subarrays of the memory cell array 40. Each sub bit line is provided with the transfer gate transistor 41 formed by a p-channel transistor for connecting the main bit line and the corresponding sub bit line with each other, the potential amplification transistor 42 formed by a p-channel transistor for controlling the potential of the main bit line on the basis of the potential of the corresponding sub bit line and a plurality of ferroelectric capacitors 33 for holding data.

The transfer gate transistor 41 has a first source/drain region connected to the main bit line and a second source/drain region connected to the corresponding sub bit line. A signal line ASS is connected to the gate of the transfer gate transistor 41. This transfer gate transistor 41 enters an ON-state in a rewrite operation, and enters an OFF-state in a read operation. The transfer gate transistor 41 is an example of the "second transistor" in the present invention.

According to the second embodiment, the potential amplification transistor 42 has a first source/drain region connected to the main bit line, a second source/drain region connected to a signal line PAS and a gate connected to the corresponding sub bit line. The second source/drain region of the transfer gate transistor 41 is connected to the gate of the potential amplification transistor 42 through the corresponding sub bit line. The threshold voltage of the potential amplification transistor 42 is set to such a level (about −0.1 V, for example) that the potential amplification transistor 42 enters an OFF-state through a potential (about 1.75 V) appearing on the corresponding sub bit line when low-level data is written in the corresponding ferroelectric capacitor 33 and enters an ON-state through a potential (about 1.65 V) appearing on the corresponding sub bit line when high-level data is written in the ferroelectric capacitor 33. The potential amplification transistor 42 is an example of the "first transistor" in the present invention. The high- and low-level data are examples of the "first data" and the "second data" in the present invention respectively.

According to the second embodiment, the main bit line is connected to a node SNT of the sense amplifier 2. A reference bit line electrically separated from the main bit line is connected to another node SNB of the sense amplifier 2.

Figure 6:
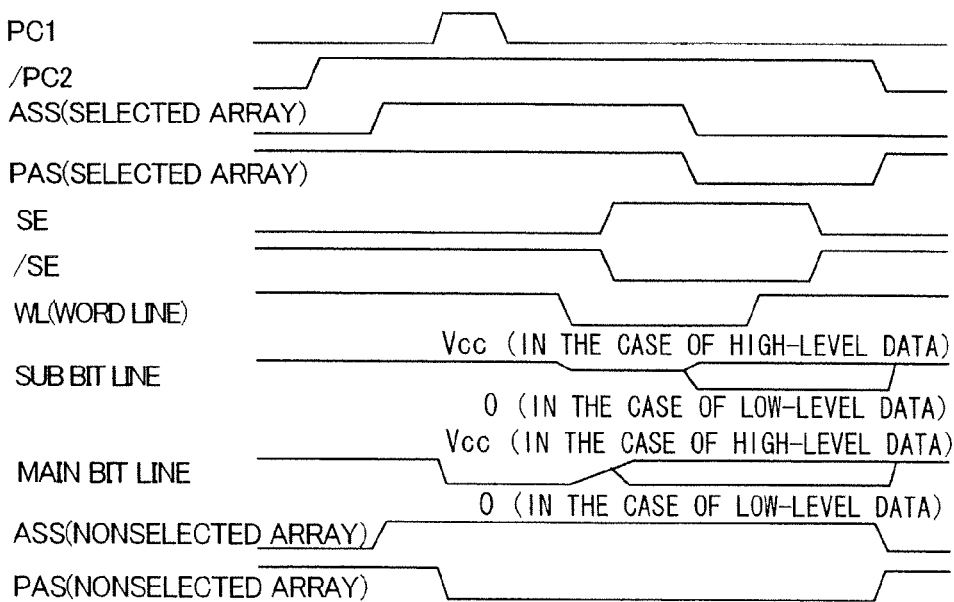
FIG. 6 is a timing chart for illustrating operations of the ferroelectric memory according to the second embodiment of the present invention.

FIG. 6 is a timing chart for illustrating operations of the ferroelectric memory according to the second embodiment of the present invention. A standby time, a setup for the read operation, the read operation and the rewrite operation in the ferroelectric memory according to the second embodiment are now described with reference to FIGS. 5 and 6. In the following description, it is assumed that the subarray adjacent to the sense amplifier 2 is selected from among six subarrays.

(Standby Time)

In the standby time, all of the signal line ASS of the selected subarray and signal lines ASS (not shown) of the nonselected subarrays are held at a step-down potential 0 V−α (α>threshold voltage Vth of transfer gate transistor 41), as shown in FIG. 6. Thus, the transfer gate transistors 41 connecting the sub bit lines and the main bit line with each other enter ON-states, thereby connecting the sub bit lines and the main bit line with each other.

Signal lines PC1 and /PC2 are held at 0 V. Thus, n-channel transistors 16c and 16d enter OFF-states and p-channel transistors 16e and 16f enter ON-states in the precharge portion 16, thereby precharging the main bit line and the sub bit lines to Vcc.

(Setup for Read Operation)

When the ferroelectric memory is accessed, the potential of the signal line /PC2 is stepped up from 0 V to Vcc, while the potentials of the signal line ASS of the selected subarray and the signal lines ASS (not shown) of the nonselected subarrays are also stepped up from 0 V to Vcc. Thus, the transfer gate transistors 41 formed by p-channel transistors enter OFF-states, thereby cutting off all sub bit lines from the main bit line. Therefore, all sub bit lines are electrically separated from the main bit line. Thus, the sub bit lines enter floating states at Vcc.

Then, the potential of the signal line PC1 is stepped up from 0 V to Vcc. Thus, the n-channel transistors 16c and 16d enter ON-states, thereby precharging the main bit line from Vcc to 0 V. After the main bit line is sufficiently precharged to 0 V, the potential of the signal line PC1 is stepped down from Vcc to 0 V. Therefore, the main bit line enters a floating state at 0 V. A reference potential generated in a reference potential generation circuit (not shown) is applied to the reference bit line, so that the node SNB of the sense amplifier 2 reaches the reference potential. The reference potential is set to an intermediate level (about 0.25 V, for example) between a potential (0 V) output to the main bit line in an operation of reading low-level data described later and a potential (about 0.5 V) output to the main bit line in an operation of reading high-level data.

(Read Operation)

In the read operation, the potential of a selected word line WL of the selected subarray is stepped down from Vcc to 0 V. Thus, a potential (read voltage) corresponding to data (low- or high-level data) written in the corresponding ferroelectric capacitor 33 appears on the sub bit line of the selected subarray. More specifically, Vcc (about 1.8 V)—about 0.05 V appears on the sub bit line when low-level data is written in the corresponding ferroelectric capacitor 33 while Vcc (about 1.8 V)—about 0.15 V appears on the sub bit line when high-level data is written in the ferroelectric capacitor 33, for example.

As hereinabove described, the threshold voltage of each potential amplification transistor 42 formed by a p-channel transistor is set to about –0.1 V. The potential of the signal line PAS is Vcc (about 1.8 V) at this time, whereby source-to-gate potential difference Vgs of the potential amplification transistor 42 is about –0.05 V if the potential of about 1.75 V corresponding to low-level data appears on the corresponding sub bit line. Therefore, the potential amplification transistor 42 remains in an OFF-state, thereby maintaining the potential of the main bit line at 0 V. If the potential of about 1.65 V corresponding to high-level data appears on the sub bit line, on the other hand, the source-to-gate potential difference Vgs of the potential amplification transistor 42 is about –0.15 V. Therefore, the potential amplification transistor 42 enters an ON-state, whereby the potential of the main bit line is pulled by the potential (Vcc) of the signal line PAS and increased to about 0.5 V. In other words, the difference (about 0.5 V) between the potential (about 0 V) of the main bit line in the case of reading low-level data and the potential (about 0.5 V) of the main bit line in the case of reading high-level data is greater than the difference (about 0.1 V) between the potential (about 1.75 V) of the sub bit line in the case of reading low-level data and the potential (about 1.65 V) of the sub bit line in the case of reading high-level data according to the second embodiment, whereby this can be regarded as amplification of potential difference. According to the second embodiment, the potential (about 0.5 V) appearing on the main bit line in the case of reading high-level data is higher than the potential (0 V) appearing in the case of reading low-level data, whereby the data of the main bit line is not reversed to but identical to the data of the selected sub bit line.

When the read voltage transmitted to the main bit line is further transmitted to the node SNT of the sense amplifier 2, the potential of a signal line SE is stepped up from 0 V to Vcc while the potential of a signal line /SE is stepped down from Vcc to 0 V. Thus, a p-channel transistor 23 of the sense amplifier 2 enters an ON-state, thereby supplying the voltage Vcc. An n-channel transistor 24 also enters an ON-state, thereby supplying the ground potential (0 V). Thus, the sense amplifier 2 is activated. The potential of the node SNT to which the potential (0 V or about 0.5 V) of the main bit line is transmitted and the potential of the node SNB to which the reference potential (about 0.25 V) is transmitted are differentially amplified, and data is read from the selected ferroelectric capacitor 33. According to the second embodiment, the main bit line is connected to the node SNT on the same polarity side of the sense amplifier 2 in the read operation so that the data thereof and the data of the sense amplifier 2 are not reversed to each other, dissimilarly to the aforementioned first embodiment. Thus, the sense amplifier 2 can read the same data as the data of the selected sub bit line (data having been written in the memory cell formed by the selected ferroelectric capacitor 33).

More specifically, the potentials of the nodes SNB and SNT are about 0.25 V and about 0 V respectively in the case of reading low-level data, for example, whereby the nodes SNB and SNT reach the potentials Vcc and 0 V respectively after amplification in the sense amplifier 2. In the case of reading high-level data, on the other hand, the potentials of the nodes SNB and SNT are about 0.25 V and about 0.5 V respectively, whereby the nodes SNB and SNT reach the potentials 0 V and Vcc respectively after amplification in the sense amplifier 2.

(Rewriting of Read Data)

Thereafter the read data is rewritten in the memory cell formed by the selected ferroelectric capacitor 33. First, the potential of the signal line ASS of the selected subarray is stepped down from Vcc to the step-down potential 0 V–α. Thus, the transfer gate transistor 41 enters an ON-state, thereby electrically connecting the main bit line and the selected sub bit line with each other. Therefore, the potential (rewrite potential) of the node SNT is transmitted to the selected sub bit line through the main bit line. According to the second embodiment, the main bit line is connected to the node SNT of the same polarity side in the rewrite operation, similarly to the read operation. Thus, the same data as the read data is written in the memory cell formed by the selected ferroelectric capacitor 33 through the corresponding sub bit line.

At this time, the potential of the signal line PAS is stepped down from Vcc to 0 V. Thus, the potential amplification transistor 42 can be inhibited from causing potential difference exceeding the threshold voltage between the source and the gate thereof also when the potential of the sub bit line connected to the gate of the potential amplification transistor 42 formed by a p-channel transistor is set to 0 V, to be inhibited from entering an ON-state in the rewrite operation.

In order to rewrite high-level data, Vcc is transmitted from the node SNT to the selected sub bit line while the potential of the selected word line WL is set to 0 V. Thus, the high-level data is rewritten in the selected ferroelectric capacitor 33. Thereafter the potential of the selected word line WL is stepped up from 0 V to Vcc. In order to rewrite low-level data, on the other hand, 0 V is transmitted from the node SNT to the selected sub bit line while the potential of the selected word line WL is set to Vcc. Thus, the low-level data is rewritten in the selected ferroelectric capacitor 33. Thereafter the potential of the signal line SE is stepped down from Vcc to 0 V while the potential of the signal line /SE is stepped up from 0 V to Vcc. Further, the potential of the signal line PAS is stepped up from 0 V to Vcc, while the potential of the signal line /PC2 is stepped down from Vcc to 0 V. Thus, the ferroelectric memory returns to a standby state.

According to the second embodiment, as hereinabove described, the ferroelectric memory, provided with the potential amplification transistors 42 each formed by the p-channel transistor having the gate connected to the corresponding sub bit line and the first source/drain region connected to the main bit line for controlling the potential of the main bit line on the basis of the potential of the corresponding sub bit line in the read operation, can control the potential of the main bit line on the basis of the potential of the selected sub bit line with the corresponding potential amplification transistor 42 formed by one p-channel transistor in the read operation, thereby suppressing increase of the number of transistors. Thus, the ferroelectric memory can be inhibited from increase of the chip area. According to the second embodiment, further, the potential (about 0.5 V) appearing on the main bit line in the case of reading high-level data is higher than the potential (0 V) appearing in the case of reading low-level data, whereby the data of the main bit line is not reversed to but identical to the data of the selected sub bit line. According to the second embodiment, therefore, the ferroelectric memory requires no inversion portion 15 having n-channel transistors 15a and 15b dissimilarly to the aforementioned first embodiment, whereby increase of the chip area of the ferroelectric memory can be further suppressed.

The remaining effects of the second embodiment are similar to those of the aforementioned first embodiment.

Third Embodiment

Figure 7:
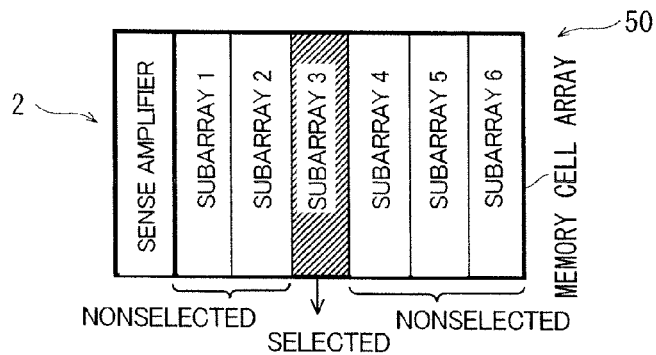
FIG. 7 is a schematic diagram showing selected and non-selected subarrays of a memory cell array in a ferroelectric memory according to a third embodiment of the present invention.
Figure 8:
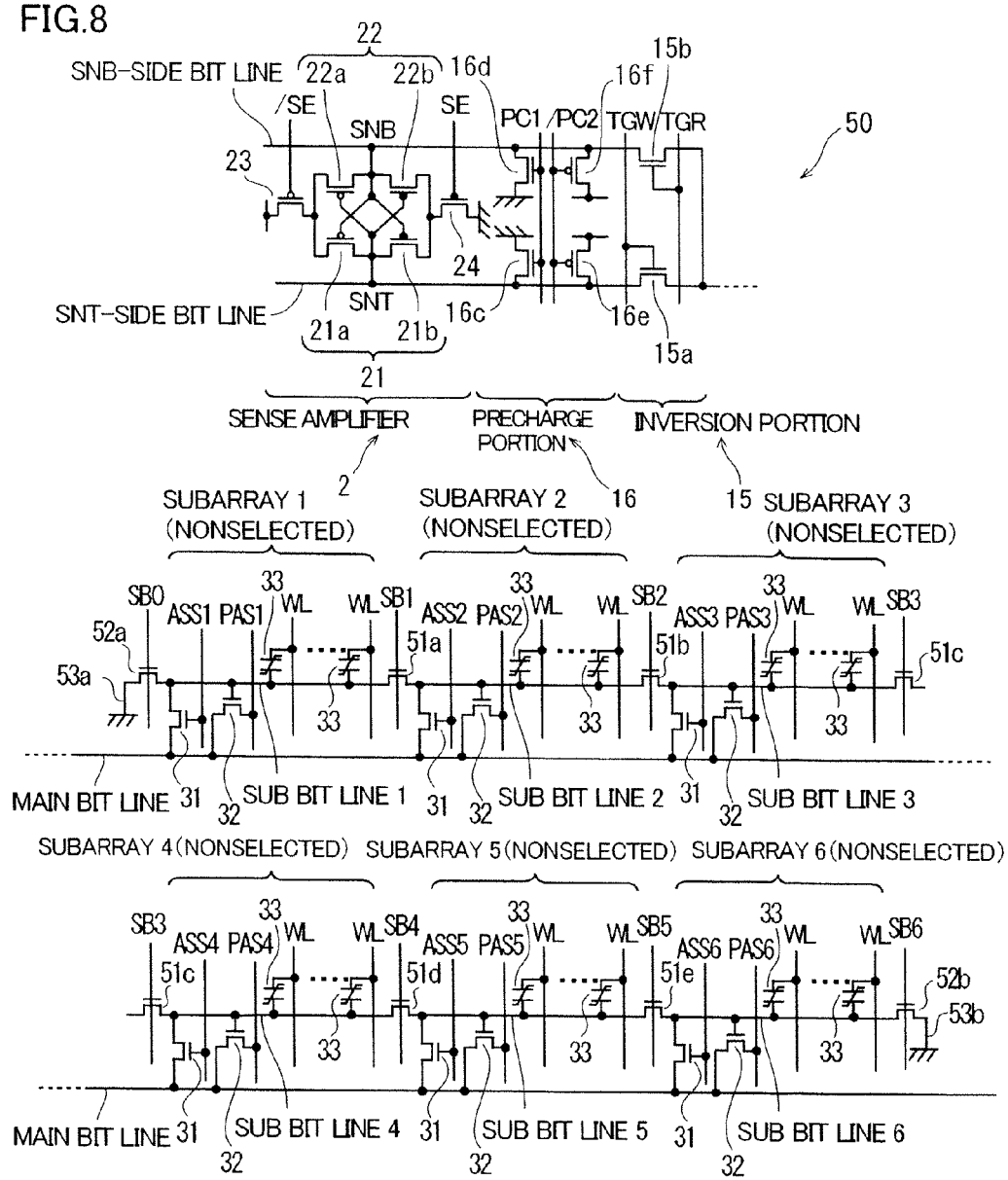
FIG. 8 is a circuit diagram detailedly showing the internal structures of a sense amplifier and the memory cell array in the ferroelectric memory according to the third embodiment shown in FIG. 7.

FIG. 7 is a schematic diagram showing selected and non-selected subarrays of a memory cell array 50 in a ferroelectric memory according to a third embodiment of the present invention. FIG. 8 is a circuit diagram detailedly showing the internal structures of a sense amplifier 2 and the memory cell array 50 in the ferroelectric memory according to the third embodiment shown in FIG. 7. Referring to FIGS. 7 and 8, the memory cell array 50 includes n-cannel transistors 51a to 51e connecting sub bit lines of a plurality of subarrays with each other and n-channel transistors 52a and 52b for connecting nonselected subarrays to the ground potential (fixed potential), dissimilarly to the aforementioned first embodiment.

According to the third embodiment, the memory cell array 50 is divided into six subarrays 1 to 6, as shown in FIGS. 7 and 8. Sub bit lines 1 to 6 are arranged on the subarrays 1 to 6 respectively.

According to the third embodiment, the n-channel transistors 51a to 51e for connecting the sub bit lines 1 to 6 with each other are provided between the sub bit lines 1 to 6 respectively. Signal lines SB1 to sB5 are provided on the gates of the n-channel transistors 51a to 51e respectively. The n-channel transistors 52a and 52b for connecting nonselected sub bit lines 1, 2 and 4 to 6 included in the sub bit lines 1 to 6 to the ground potential (fixed potential) are arranged on both ends of the memory cell array 50 constituted of the subarrays 1 to 6. Signal lines SB0 and SB6 are connected to the gates of the n-channel transistors 52a and 52b respectively. The n-channel transistor 52a has a first source/drain region connected to the sub bit line 1 and a second source/drain region connected to a ground wire (GND wire) 53a. The n-channel transistor 52b has a first source/drain region connected to the sub bit line 6 and a second source/drain region connected to another ground wire (GND wire) 53b. The n-channel transistors 51a to 51e are examples of the "third transistor" in the present invention.

A standby time and a setup for a read operation in the ferroelectric memory according to the third embodiment are described with reference to FIGS. 8 and 9. In the following description, it is assumed that the subarray 3 is selected from among the subarrays 1 to 6. The read operation and an operation of rewriting read data are identical to those according to the aforementioned first embodiment, and hence redundant description is not repeated.

(Standby Time)

Figure 9:
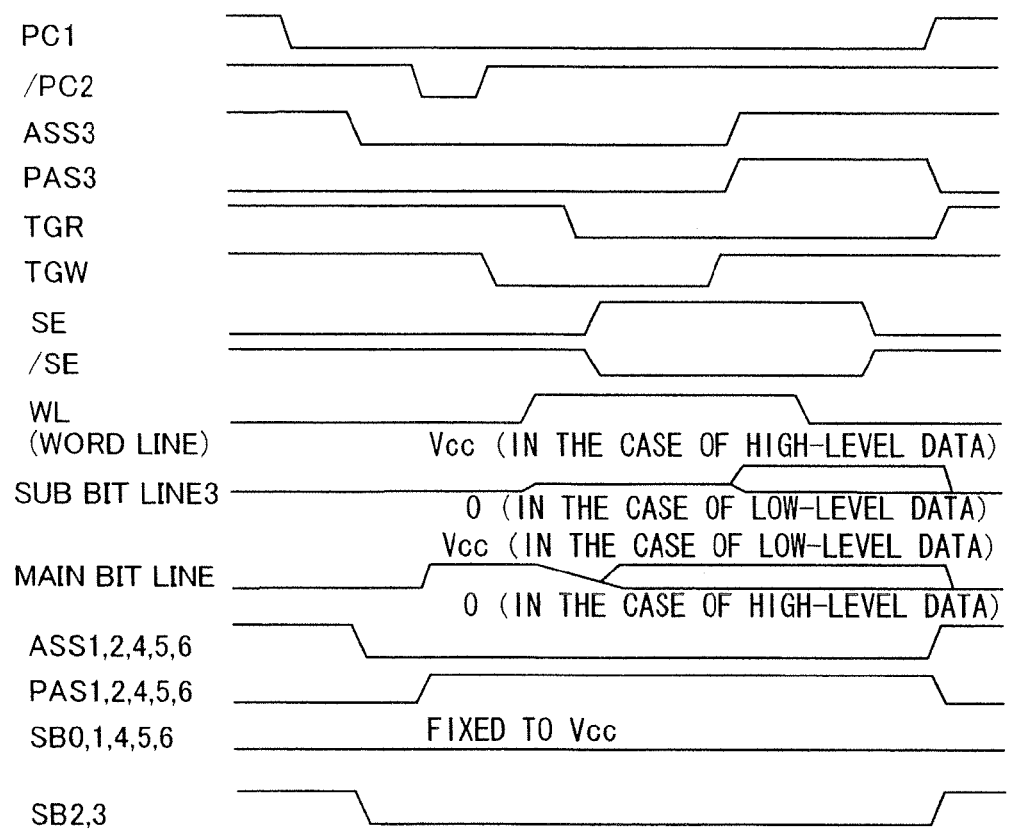
FIG. 9 is a timing chart for illustrating operations of the ferroelectric memory according to the third embodiment of the present invention.

In the standby time, all signal lines ASS1 to ASS6 are held at a step-up potential Vcc+α (α>threshold voltage Vth of transfer gate transistor 31), as shown in FIG. 9. Thus, transfer gate transistors 31 connecting the sub bit lines 1 to 6 and the main bit line with each other enter ON-states, thereby connecting the sub bit lines 1 to 6 and the main bit line with each other.

On the other hand, all signal lines SB1 to SB5 are held at Vcc. Thus, the n-channel transistors 51a to 51e arranged between the sub bit lines 1 to 6 enter ON-states, thereby connecting all sub bit lines 1 to 6 with each other.

Signal lines TGR and TGW are also held at the step-up potential Vcc+α (α>threshold voltage Vth of n-channel transistors 15a and 15b). Thus, an SNB-side bit line and the main bit line are connected with each other, while an SNT-side bit line and the main bit line are also connected with each other.

On the other hand, signal lines PC1 and /PC2 as well as the signal lines SB0 and SB6 are held at Vcc. Thus, n-channel transistors 16c and 16d of a precharge portion 16 enter ON-states and p-channel transistors 16e and 16f enter OFF-states while the n-channel transistors 52a and 52b for connecting the nonselected sub bit lines 1, 2 and 4 to 6 with the ground wires 53a and 53b also enter ON-states, thereby precharging the SNT-side bit line, the SNB-side bit line, the main bit line and the sub bit lines 1 to 6 to the ground potential (0 V).

(Setup for Read Operation)

When the ferroelectric memory is accessed, the potential of the signal line PC1 is stepped down from Vcc to 0 V while the potentials of the signal lines ASS1 to ASS6 of the subarrays 1 to 6 are stepped down from Vcc to 0 V. Thus, the transfer gate transistors 31 of the sub bit lines 1 to 6 enter OFF-states, thereby cutting off the sub bit lines 1 to 6 from the main bit line.

The potentials of the signal lines SB2 and SB3 for the n-channel transistors 51b and 51c provided on both ends of the selected sub bit line 3 are stepped down from Vcc to 0 V respectively. Thus, the n-channel transistor 51b connecting the sub bit lines 2 and 3 with each other and the n-channel transistor 51c connecting the sub bit lines 3 and 4 with each other enters OFF-states. Thus, the selected sub bit line 3 is electrically separated from the remaining nonselected sub bit lines 1, 2 and 4 to 6. Therefore, the selected sub bit line 3 enters a floating state at 0 V. On the other hand, the signal lines SB0, SB1 and SB4 to SB6 are maintained at Vcc. Thus, the sub bit lines 1 and 2 of the nonselected subarrays 1 and 2 are connected to the ground potential (0 V) through the ground wire 53a, while the sub bit lines 4 to 6 of the nonselected subarrays 4 to 6 are connected to the ground potential (0 V) through the ground wire 53b.

Then, the potential of the signal line /PC2 is stepped down from Vcc to 0 V. Thus, the p-channel transistors 16e and 16f enter ON-states, thereby precharging the main bit line from 0 V to Vcc through the SNT- and SNB-side bit lines. After the main bit line is sufficiently precharged to Vcc, the potential of the signal line /PC2 is stepped up from 0 V to Vcc. Then, the potential of the signal line TGW is stepped down from Vcc to 0 V. Thus, the n-channel transistor 15a enters an OFF-state, thereby electrically separating the SNT-side bit line and the main bit line from each other. Therefore, the main bit line enters a floating state at Vcc (about 1.8 V). A reference potential generated in a reference potential generation circuit (not shown) is applied to the SNT-side bit line, whereby a node SNT of the sense amplifier 2 reaches the reference potential. The reference potential is set to an intermediate level between a potential output to the main bit line in an operation of reading low-level data and a potential output to the main bit line in an operation of reading high-level data.

According to the third embodiment, as hereinabove described, the ferroelectric memory is provided with the n-channel transistors 51a to 51e connecting the sub bit lines 1 to 6 with each other for connecting the sub bit lines 1 and 2 of the nonselected subarrays 1 and 2 with each other through the n-channel transistor 51a and connecting the sub bit lines 4 to 6 of the nonselected subarrays 4 to 6 with each other through the n-channel transistors 51d and 51e in the read operation, whereby the nonselected sub bit lines 1, 2 and 4 to 6 can be connected to the ground potential on both ends of the memory cell array 50. Thus, the nonselected sub bit lines 1, 2 and 4 to 6 can be prevented from entering floating states. Consequently, the sub bit lines 1 to 6 can be prevented from propagation of noise, whereby disturbance can be suppressed. Further, the ground wires 53a and 53b are so arranged on both ends of the memory cell array 50 that the ferroelectric memory requires only two fixed potentials (ground wires 53a and 53b) also when the number of subarrays is increased, whereby the memory cell array 50 including the plurality of subarrays can be inhibited from increase of the chip area.

According to the third embodiment, as hereinabove described, the ferroelectric memory is provided with the n-channel transistors 52a and 52b arranged on both ends of the memory cell array 50 for connecting the nonselected sub bit lines 1, 2 and 4 to 6 to the ground wires 53a and 53b and connects the sub bit lines 1, 2 and 4 to 6 of the nonselected subarrays 1, 2 and 4 to 6 connected with each other by the n-channel transistors 51a, 51d and 51e to the ground wires 53a and 53b through the n-channel transistors 52a and 52b in the read operation, whereby the sub bit lines 1, 2 and 4 to 6 of the plurality of nonselected subarrays 1, 2 and 4 to 6 can be easily grounded on both ends of the memory cell array 50.

According to the third embodiment, as hereinabove described, the n-channel transistors 51b and 51c positioned on both ends of the sub bit line 3 of the selected subarray 3 enter OFF-states while the n-channel transistors 51a, 51d and 51e positioned between the nonselected subarrays 1, 2 and 4 to 6 enter ON-states in the read operation, whereby the nonselected sub bit lines 1, 2 and 4 to 6 can be connected to the ground wires 53a and 53b provided on both ends of the memory cell array 50 through the n-channel transistors 51a, 51d and 51e while electrically separating the selected sub bit line 3 from the nonselected sub bit lines 1, 2 and 4 to 6.

The remaining effects of the third embodiment are similar to those of the aforementioned first embodiment.

Fourth Embodiment

The structure of a ferroelectric memory according to a fourth embodiment of the present invention is described with reference to FIGS. 1, 2 and 10. The fourth embodiment of the present invention is applied to a simple matrix ferroelectric memory, which is an exemplary memory.

The overall structure of the simple matrix ferroelectric memory according to the fourth embodiment and the structure of a memory cell array 100 thereof are similar to those of the aforementioned first embodiment shown in FIGS. 1 and 2.

Figure 10:
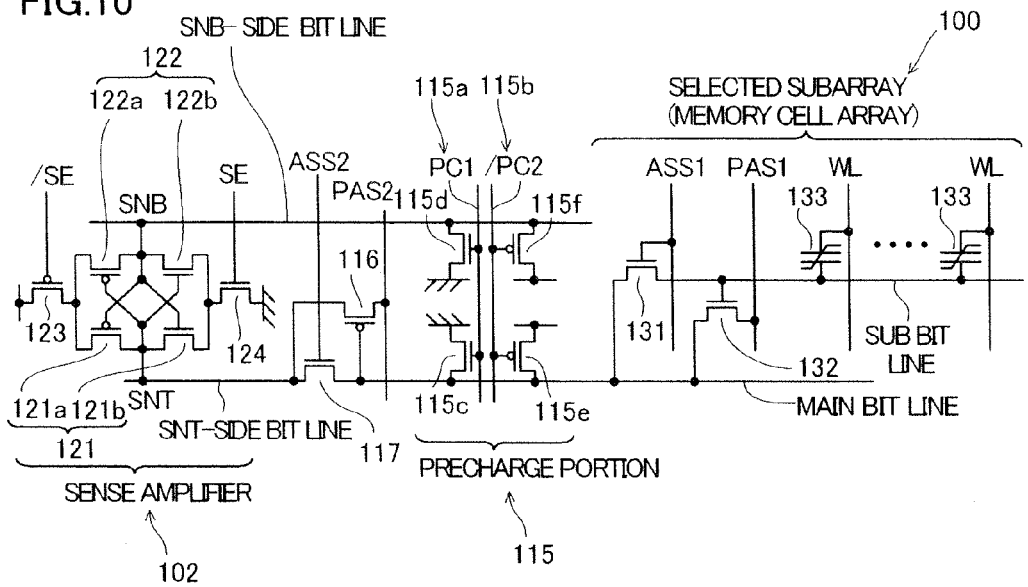
FIG. 10 is a circuit diagram detailedly showing the internal structures of a sense amplifier and a subarray adjacent to the sense amplifier in a ferroelectric memory according to a fourth embodiment of the present invention.

According to the fourth embodiment, a precharge portion 115, a potential amplification transistor 116 formed by a p-channel transistor, a transfer gate transistor 117 and a sense amplifier 102 are sequentially connected to the memory cell array 100, as shown in FIG. 10. The potential amplification transistor 116 is an example of the "fourth transistor" in the present invention. Sub bit lines are arranged on subarrays of the memory cell array 100. Each of the sub bit lines is provided with a transfer gate transistor 131 formed by an n-channel transistor for connecting a main bit line and the corresponding sub bit line with each other and a potential amplification transistor 132 formed by an n-channel transistor for controlling the potential of the main bit line on the basis of the potential of the corresponding sub bit line. The potential amplification transistor 132 is an example of the "first transistor" in the present invention.

The transfer gate transistor 131 has a first source/drain region connected to the main bit line and a second source/drain region connected to the corresponding sub bit line. A signal line ASS1 is connected to the gate of the transfer gate transistor 131. This transfer gate transistor 131 enters an OFF-state in a read operation. The transfer gate transistor 131 is an example of the "fifth transistor" in the present invention.

According to the fourth embodiment, the potential amplification transistor 132 has a first source/drain region connected to the main bit line, a second source/drain region connected to a signal line PAS1 and a gate connected to the corresponding sub bit line. The second source/drain region of the transfer gate transistor 131 is connected to the gate of the potential amplification transistor 132 through the corresponding sub bit line. The threshold voltage of the potential amplification transistor 132 is set to such a level (about 0.1 V, for example) that the potential amplification transistor 132 enters an ON-state through a potential (about 0.15 V) appearing on the corresponding sub bit line when high-level data is written in a corresponding ferroelectric capacitor 133 and enters an OFF-state through a potential (about 0.05 V) appearing on the corresponding sub bit line when low-level data is written in the ferroelectric capacitor 133. The high- and low-level data are examples of the "first data" and the "second data" in the present invention respectively.

The precharge portion 115 includes a precharge portion 115a for precharging the bit lines to the ground potential and another precharge portion 115b for precharging the bit lines to a power supply potential (Vcc). The precharge portion 115a is constituted of an n-channel transistor 115c connected between the main bit line and the ground potential and another n-channel transistor 115d connected between an SNB-side bit line and the ground potential. A signal line PC1 is connected to the gates of the n-channel transistors 115c and 115d. The precharge portion 115b is constituted of a p-channel transistor 115e connected between the main bit line and the power supply potential (Vcc) and another p-channel transistor 115f connected between the SNB-side bit line and the power supply potential (Vcc). A signal line /PC2 is connected to the gates of the p-channel transistors 115e and 115f.

According to the fourth embodiment, the potential amplification transistor 116 is formed by a p-channel transistor reversed in polarity to each potential amplification transistor 132 formed by an n-channel transistor, and provided for controlling the potential of an SNT-side bit line on the basis of the potential of the main bit line. This potential amplification transistor 116 has a first source/drain region connected to a signal line PAS2, a second source/drain region connected to the SNT-side bit line and a gate connected to the main bit line. The threshold voltage of the potential amplification transistor 116 is set to such a level (about −0.25 V, for example) that the potential amplification transistor 116 enters an ON-state through a potential (about 1.3 V) appearing on the main bit line when high-level data is written in a selected ferroelectric capacitor 133 and enters an OFF-state through a potential (about 1.8 V) appearing on the main bit line when low-level data is written in the ferroelectric capacitor 133.

The sense amplifier 102 is formed by cross-coupling inputs and outputs of two CMOS inverter circuits 121 and 122 with each other. The CMOS inverter circuit 121 is constituted of a p-channel transistor 121a and an n-channel transistor 121b, while the CMOS inverter circuit 122 is constituted of a p-channel transistor 122a and an n-channel transistor 122b. The power supply potential (Vcc) is connected to first source/drain regions of the p-channel transistors 121a and 122a through a p-channel transistor 123. First source/drain regions of the n-channel transistors 121b and 122b are grounded through an n-channel transistor 124. Signal lines /SE and SE are connected to the gates of the p-channel transistor 123 and the n-channel transistor 124 respectively. The gates of the p-channel transistor 122a and the n-channel transistor 122b are connected to a node SNB, while the gates of the p-channel transistor 121a and the n-channel transistor 121b are connected to another node SNT. The SNB-side bit line is connected to the node SNB, while the SNT-side bit line is connected to the node SNT.

A standby time, a setup for a read operation, the read operation and an operation of rewriting read data in the ferroelectric memory according to the fourth embodiment are now described with reference to FIG. 11. In the following description, it is assumed that the subarray adjacent to the sense amplifier 102 is selected from among four subarrays.

(Standby Time)

In the standby time, all of the signal line ASS1 of the selected subarray and signal lines ASS1 (not shown) of the nonselected subarrays are held at a step-up potential Vcc+α

Figure 11:
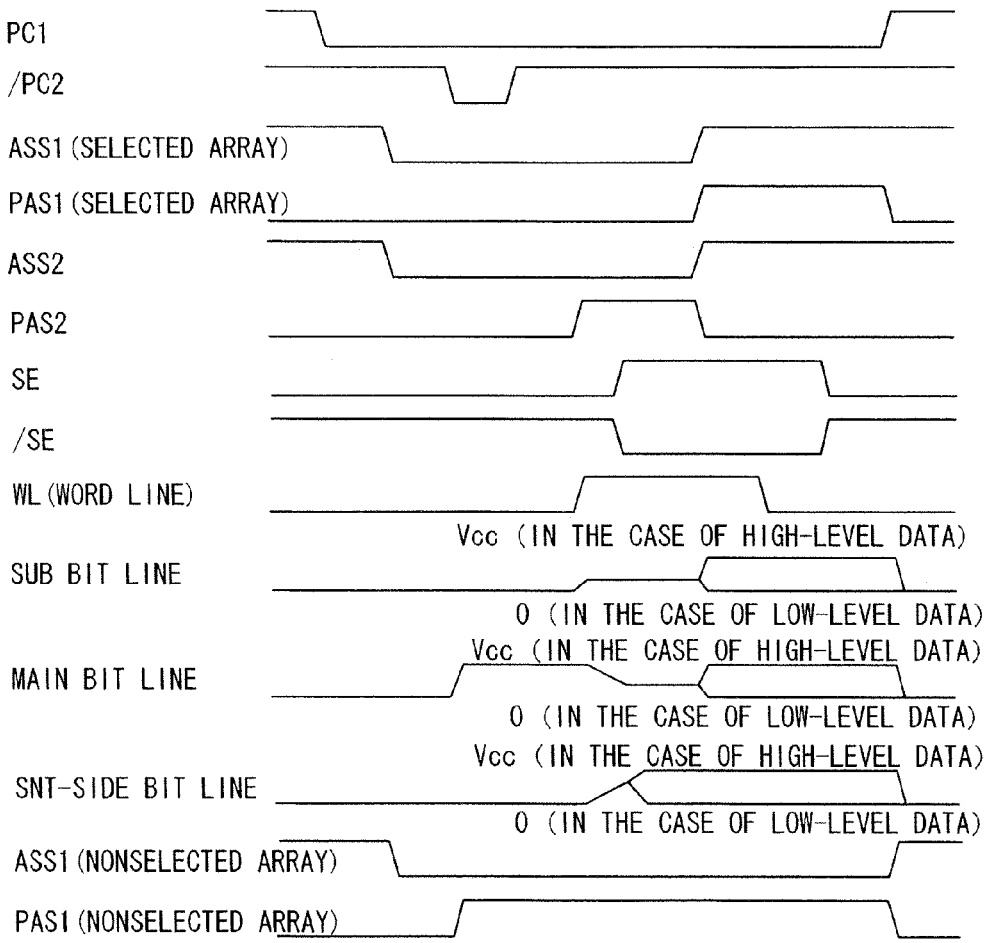
FIG. 11 is a timing chart for illustrating operations of the ferroelectric memory according to the fourth embodiment of the present invention.

(α>threshold voltage Vth of transfer gate transistor 131), as shown in FIG. 11. Thus, the transfer gate transistors 131 connecting the sub bit lines and the main bit line with each other enter ON-states, thereby connecting the sub bit lines and the main bit line with each other.

A signal line ASS2 is similarly held at the step-up potential Vcc+α. Thus, the transfer gate transistor 117 connecting the node SNT of the sense amplifier 102 and the main bit line with each other enters an ON-state, thereby connecting the node SNT of the sense amplifier 102 and the main bit line with each other.

On the other hand, the signal lines PC1 and /PC2 are held at Vcc. Thus, the n-channel transistors 115c and 115d of the precharge portion 115 enter ON-states while the p-channel transistors 115e and 115f enter OFF-states, thereby precharging the SNB-side bit line, the main bit line and the sub bit lines to the ground potential (0 V).

(Setup for Read Operation)

When the ferroelectric memory is accessed, the potential of the signal line PC1 is stepped down from Vcc to 0 V, while the potentials of the signal line ASS1 of the selected subarray and the signal lines ASS1 (not shown) of the nonselected subarrays are also stepped down from Vcc to 0 V. Thus, the transfer gate transistors 131 enter OFF-states, thereby cutting off all sub bit lines from the main bit line. Therefore, all sub bit lines are electrically separated from the main bit line. Thus, the sub bit lines enter floating states at 0 V.

At the same time, the potential of the signal line ASS2 is stepped down from Vcc to 0 V. Thus, the transfer gate transistor 117 enters an OFF-state, thereby cutting off the node SNT of the sense amplifier 102 from the main bit line. Therefore, the main bit line enters a floating state at 0 V.

Then, the potential of the signal line /PC2 is stepped down from Vcc to 0 V. Thus, the p-channel transistors 115e and 115f enter OFF-states, thereby precharging the SNB-side bit line and the main bit line from 0 V to Vcc. After the main bit line is sufficiently precharged to Vcc, the potential of the signal line /PC2 is stepped up from 0 V to Vcc. Therefore, the main bit line enters a floating state at Vcc (about 1.8 V). Then, the potential of the signal line PAS2 is stepped up from 0 V to Vcc. A reference potential generated in a reference potential generation circuit (not shown) is applied to the SNB-side bit line, whereby the node SNB of the sense amplifier 102 reaches the reference potential. The reference potential is set to an intermediate level (about 0.5 V, for example) between a potential (about 0 V) output to the SNT-side bit line in an operation of reading low-level data described later and a potential (about 1.0 V) output to the SNT-side bit line in an operation of reading high-level data. On the other hand, the SNT-side bit line is connected to the ground potential (0 V), thereby setting the node SNT of the sense amplifier 102 to the ground potential (0 V). Thereafter the SNT-side bit line enters a floating state at about 0 V.

(Read Operation)

In the read operation, the potential of a selected word line WL of the selected subarray is stepped up from 0 V to Vcc. Thus, a potential (read voltage) corresponding to data (low- or high-level data) written in a selected ferroelectric capacitor 133 appears on the sub bit line of the selected subarray. More specifically, a potential of about 0.05 V appears on the sub bit line if low-level data is written in the corresponding ferroelectric capacitor 133 while a potential of about 0.15 V appears on the sub bit line if high-level data is written in the ferroelectric capacitor 133, for example.

The threshold voltage of the potential amplification transistor 132 formed by an n-channel transistor is set to about 0.1 V, as hereinabove described. The potential of the signal line PAS1 is 0 V at this time, whereby source-to-gate potential difference Vgs of the potential amplification transistor 132 is about 0.05 V if the potential of about 0.05 V corresponding to low-level data appears on the sub bit line. Therefore, the potential amplification transistor 132 remains in an OFF-state, thereby maintaining the potential of the main bit line at Vcc (about 1.8 V). If the potential of about 0.15 V corresponding to high-level data appears on the sub bit line, on the other hand, the source-to-gate potential difference Vgs of the potential amplification transistor 132 is about 0.15 V. Therefore, the potential amplification transistor 132 enters an ON-state, whereby the potential of the main bit line is pulled by the potential (0 V) of the signal line PAS1 and reduced to about 1.3 V. In other words, the difference (about 0.5 V) between the potential (about 1.8 V) of the main bit line in the case of reading low-level data and the potential (about 1.3 V) of the main bit line in the case of reading high-level data is greater than the difference (about 0.1 V) between the potential (about 0.05 V) of the sub bit line in the case of reading low-level data and the potential (about 0.15 V) of the sub bit line in the case of reading high-level data according to the fourth embodiment, whereby this can be regarded as amplification of potential difference.

According to the fourth embodiment, the threshold voltage of the potential amplification transistor 116 formed by a p-channel transistor is set to about −0.25 V. The potential of the signal line PAS2 is Vcc (about 1.8 V), whereby source-to-gate potential difference Vgs of the potential amplification transistor 116 is about 0 V if the potential of the main bit line is maintained at about 1.8 V corresponding to low-level data. Therefore, the potential amplification transistor 116 remains in an OFF-state, thereby maintaining the potential of the SNT-side bit line at about 0 V. If the potential of about 1.3 V corresponding to high-level data appears on the main bit line, on the other hand, the source-to-gate potential difference Vgs of the potential amplification transistor 116 is about −0.5 V. Therefore, the potential amplification transistor 116 enters an ON-state, whereby the potential of the SNT-side bit line is pulled by the potential (1.8 V) of the signal line PAS2 and increased from 0 V to about 1.0 V. In other words, the difference (about 1.0 V) between the potential (about 0 V) of the SNT-side bit line in the case of reading low-level data and the potential (about 1.0 V) of the SNT-side bit line in the case of reading high-level data is greater than the difference (about 0.5 V) between the potential (about 1.8 V) of the main bit line in the case of reading low-level data and the potential (about 1.3 V) of the main bit line in the case of reading high-level data according to the fourth embodiment, whereby this can be regarded as amplification of potential difference.

When the read voltage transmitted to the SNT-side bit line is further transmitted to the node SNT of the sense amplifier 102, the potential of the signal line SE is stepped up from 0 V to Vcc while the potential of the signal line /SE is stepped down from Vcc to 0 V. Thus, the p-channel transistor 123 of the sense amplifier 102 enters an ON-state, thereby supplying the voltage Vcc. The n-channel transistor 124 also enters an ON-state, thereby supplying the ground potential (0 V). Thus, the sense amplifier 102 is activated. The potential of the node SNT to which the potential (about 0 V or about 1.8 V) of the SNT-side bit line is transmitted and the potential of the node SNB to which the reference potential (about 0.9 V) is transmitted are differentially amplified, and data is read from the selected ferroelectric capacitor 133.

More specifically, the potentials of the nodes SNT and SNB are about 0 V and about 0.5 V respectively in the case of reading low-level data, for example, whereby the nodes SNT and SNB reach the potentials 0 V and Vcc respectively after amplification in the sense amplifier 102. In the case of reading high-level data, on the other hand, the potentials of the nodes SNT and SNB are about 1.0 V and about 0.5 V respectively, whereby the nodes SNT and SNB reach the potentials Vcc and 0 V respectively after amplification in the sense amplifier 102.

(Rewriting of Read Data)

Thereafter the read data is rewritten in a memory cell formed by the selected ferroelectric capacitor 133. First, the potential of the signal line ASS2 is stepped up from 0 V to the step-up potential Vcc+α. Thus, the transfer gate transistor 117 enters an ON-state, thereby electrically connecting the node SNT of the sense amplifier 102 and the main bit line with each other. The signal line ASS1 of the selected subarray is stepped up from 0 V to the step-up potential Vcc+α. Thus, the corresponding transfer gate transistor 131 enters an ON-state, thereby electrically connecting the main bit line and the selected sub bit line with each other. Therefore, the potential (rewrite potential) of the node SNT is transmitted to the sub bit line through the main bit line.

At this time, the potential of the signal line PAS1 is stepped up from 0 V to Vcc. Thus, the potential amplification transistor 132 can be inhibited from causing potential difference exceeding the threshold voltage between the source and the gate thereof also when the potential of the corresponding sub bit line connected to the gate of the potential amplification transistor 132 is set to Vcc, to be inhibited from entering an ON-state in the rewrite operation.

Similarly, the potential of the signal line PAS2 is stepped down from Vcc to 0 V. Thus, the potential amplification transistor 116 can be inhibited from causing potential difference exceeding the threshold voltage between the source and the gate thereof also when the potential of the main bit line connected to the gate of the potential amplification transistor 116 is set to 0 V, to be inhibited from entering an ON-state in the rewrite operation.

In order to rewrite low-level data, 0 V is transmitted from the node SNT to the selected sub bit line while the potential of the selected word line WL is set to Vcc. Thus, the low-level data is rewritten in the selected ferroelectric capacitor 133. Thereafter the potential of the selected word line WL is stepped down from Vcc to 0 V. In order to rewrite high-level data, on the other hand, Vcc is transmitted from the node SNT to the selected sub bit line while the potential of the selected word line WL is set to 0 V. Thus, the high-level data is rewritten in the selected ferroelectric capacitor 133. Thereafter the potential of the signal line SE is stepped down from Vcc to 0 V, while the potential of the signal line /SE is stepped up from 0 V to Vcc. Further, the potential of the signal line PAS1 is stepped down from Vcc to 0 V, while the potential of the signal line PC1 is stepped up from 0 V to Vcc. Thus, the ferroelectric memory returns to a standby state.

According to the fourth embodiment, as hereinabove described, the ferroelectric memory is provided with the potential amplification transistor 116, formed by the p-channel transistor reversed in polarity to the potential amplification transistor 132 formed by an n-channel transistor, having the gate connected to the main bit line and the second source/drain region connected to the SNT-side bit line for controlling the potential of the SNT-side bit line on the basis of the potential of the main bit line in the read operation so that the potential read from the selected sub bit line onto the main bit line in the read operation is amplified by the potential amplification transistor 132 formed by an n-channel transistor and thereafter further amplified by the potential amplification transistor 116 formed by the p-channel transistor reversed in polarity to the potential amplification transistor 132, whereby the time for driving the main bit line to the potential necessary for differential amplification through the sense amplifier 102 can be reduced. Thus, the time required for the read operation of the simple matrix ferroelectric memory can be reduced.

According to the fourth embodiment, the ferroelectric memory is provided with the potential amplification transistors 132 each formed by an n-channel transistor and the potential amplification transistor 116 formed by a p-channel transistor so that a potential corresponding to high-level data appears on the SNT-side bit line through the potential amplification transistor 116 due to a potential corresponding to low-level data appearing on the main bit line through the corresponding potential amplification transistor 132 when the potential corresponding to high-level data appears on the selected sub bit line while the potential corresponding to low-level data appears on the SNT-side bit line through the potential amplification transistor 116 due to the potential corresponding to high-level data appearing on the main bit line through the corresponding potential amplification transistor 132 when the potential corresponding to low-level data appears on the selected sub bit line. Thus, the data appearing on the selected sub bit line and the data appearing on the SNT-side bit line to be transmitted to the sense amplifier 102 can be inhibited from reversion also when amplification is performed through the potential amplification transistors 132 and 116.

According to the fourth embodiment, the potential amplification transistor 132, formed to have the threshold voltage (about 0.1 V) for entering an ON-state in the case of reading high-level data and entering an OFF-state in the case of reading low-level data, can be switched between an ON-state and an OFF-state in response to the potential of the corresponding sub bit line received in the gate thereof in the read operation, whereby the potential of the main bit line can be easily controlled through the first source/drain region of the potential amplification transistor 132 connected to the main bit line. Thus, the high- or low-level data written in the selected ferroelectric capacitor 133 can be easily read by detecting the potential of the main bit line.

According to the fourth embodiment, the ferroelectric memory is provided with the signal line PAS1 connected to the second source/drain region of the potential amplification transistor 132 and is so formed as to bring the main bit line into a floating state at Vcc (about 1.8 V) and hold the signal line PAS1 at 0 V in the read operation, whereby the potential amplification transistor 132 enters an ON-state thereby connecting the main bit line and the signal line PAS1 with each other when a potential (about 0.15 V) corresponding to high-level data appears on the selected sub bit line so that the potential of the main bit line is pulled by the potential of the signal line PAS1 and reduced to about 1.3 V. When a potential (about 0.05 V) corresponding to low-level data appears on the sub bit line, on the other hand, the potential amplification transistor 132 remains in an OFF-state, thereby maintaining the potential of the main bit line at Vcc (about 1.8 V). Thus, the potential difference of about 0.1 V appearing on the sub bit line can be amplified to about 0.5 V and transmitted to the main bit line.

According to the fourth embodiment, the potential of the signal line PAS1 is stepped up from 0 V to Vcc in the rewrite operation, whereby the potential amplification transistor 132 can be inhibited from entering an ON-state in the rewrite operation. Thus, electrical connection between the main bit line and the signal line PAS1 can be so suppressed that the potential of the main bit line can be inhibited from reduction resulting from the potential of the signal line PAS1.

According to the fourth embodiment, the ferroelectric memory is provided with the transfer gate transistor 131 formed by the n-channel transistor having the second source/drain region connected to the corresponding sub bit line and the first source/drain region connected to the main bit line for turning off the transfer gate transistor 131 in the read operation and turning on the same in the rewrite operation, thereby rewriting data in the rewrite operation by electrically connecting the main bit line and the selected sub bit line with each other.

Fifth Embodiment

Figure 12:
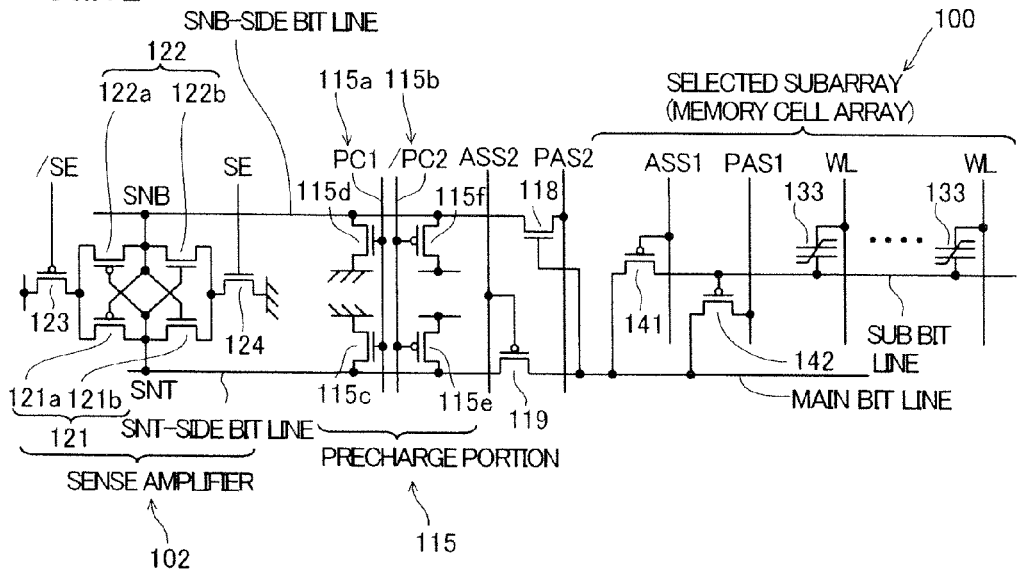
FIG. 12 is a circuit diagram detailedly showing the internal structures of a sense amplifier and a subarray adjacent to the sense amplifier in a ferroelectric memory according to a fifth embodiment of the present invention.

Referring to FIG. 12, transfer gate transistors 119 and 141 and potential amplification transistors 142 are formed by p-channel transistors and a potential amplification transistor 118 is formed by an n-channel transistor in a ferroelectric memory according to a fifth embodiment, dissimilarly to the aforementioned fourth embodiment.

In the ferroelectric memory according to the fifth embodiment, the potential amplification transistor 118 formed by an n-channel transistor, the transfer gate transistor 119 formed by a p-channel transistor, a precharge portion 115 and a sense amplifier 102 are sequentially connected to a memory cell array 100, as shown in FIG. 12. The potential amplification transistor 118 is an example of the "fourth transistor" in the present invention. Sub bit lines are arranged on subarrays of the memory cell array 100. Each sub bit line is provided with the transfer gate transistor 141 formed by a p-channel transistor for connecting a main bit line and the corresponding sub bit line with each other and the potential amplification transistor 142 formed by a p-channel transistor for controlling the potential of the main bit line on the basis of the potential of the corresponding sub bit line. The potential amplification transistor 142 is an example of the "first transistor" in the present invention.

The transfer gate transistor 141 has a first source/drain region connected to the main bit line and a second source/drain region connected to the corresponding sub bit line. A signal line ASS1 is connected to the gate of the transfer gate transistor 141. This transfer gate transistor 141 enters an OFF-state in a read operation. The transfer gate transistor 141 is an example of the "fifth transistor" in the present invention.

According to the fifth embodiment, the potential amplification transistor 142 has a first source/drain region connected to the main bit line, a second source/drain region connected to a signal line PAS1 and a gate connected to the corresponding sub bit line. The second source/drain region of the transfer gate transistor 141 is connected to the gate of the potential amplification transistor 142 through the corresponding sub bit line. The threshold voltage of the potential amplification transistor 142 is set to such a level (about −0.1 V, for example) that the potential amplification transistor 142 enters an OFF-state through a potential (about 1.75 V) appearing on the corresponding sub bit line when low-level data is written in a corresponding ferroelectric capacitor 133 and enters an ON-state through a potential (about 1.65 V) appearing on the corresponding sub bit line when high-level data is written in the ferroelectric capacitor 133. The high- and low-level data are examples of the "first data" and the "second data" in the present invention respectively.

According to the fifth embodiment, the potential amplification transistor 118 is formed by an n-channel transistor reversed in polarity to each potential amplification transistor 142 formed by a p-channel transistor, and provided for controlling the potential of an SNB-side bit line on the basis of the potential of the main bit line. This potential amplification transistor 118 has a first source/drain region connected to a signal line PAS2, a second source/drain region connected to the SNB-side bit line and a gate connected to the main bit line. The threshold voltage of the potential amplification transistor 118 is set to such a level (about 0.25 V, for example) that the potential amplification transistor 118 enters an ON-state through a potential (about 0.5 V) appearing on the main bit line when high-level data is written in a selected ferroelectric capacitor 133 and enters an OFF-state through a potential (about 0 V) appearing on the main bit line when low-level data is written in the ferroelectric capacitor 133.

The remaining structure of the fifth embodiment is similar to that of the aforementioned fourth embodiment.

A standby time, a setup for a read operation, the read operation and an operation of rewriting read data in the ferroelectric memory according to the fifth embodiment are now described with reference to FIG. 13. In the following description, it is assumed that the subarray adjacent to the sense amplifier 102 is selected from among four subarrays.

(Standby Time)

Figure 13:
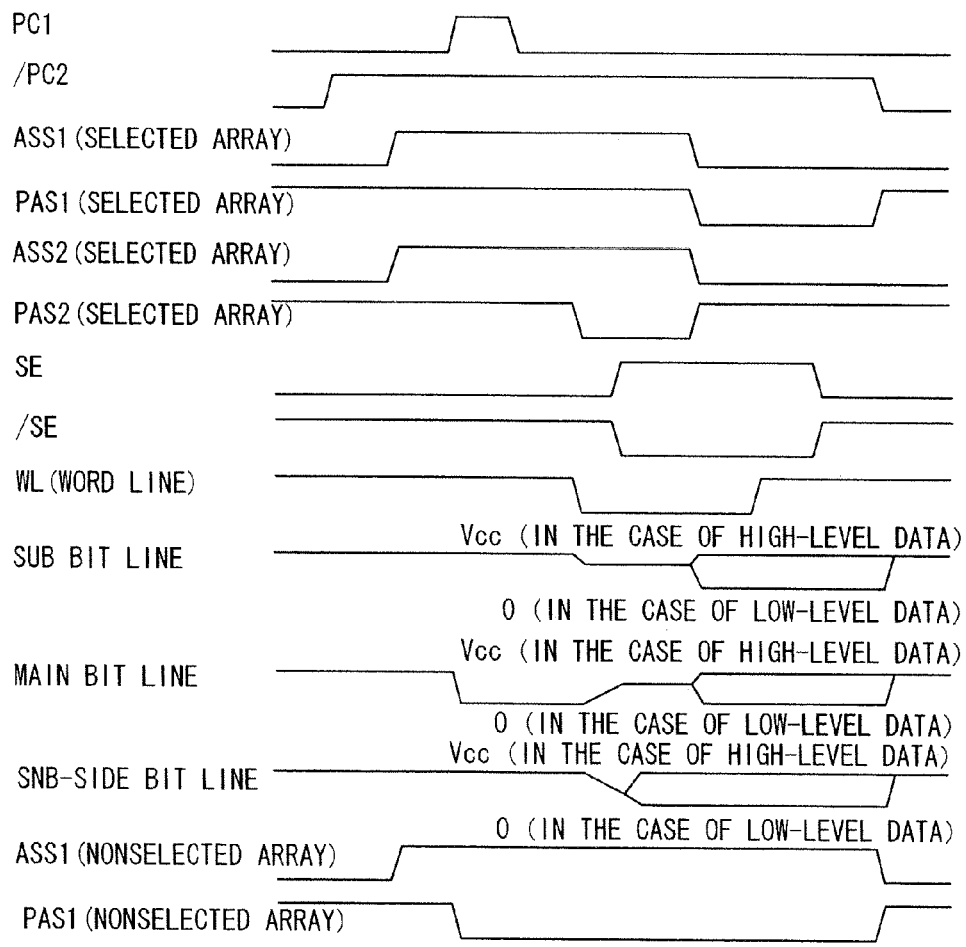
FIG. 13 is a timing chart for illustrating operations of the ferroelectric memory according to the fifth embodiment of the present invention.

In the standby time, all of the signal line ASS1 of the selected subarray and signal lines ASS1 (not shown) of the nonselected subarrays are held at a step-down potential 0 V−α (α>absolute value of threshold voltage Vth of transfer gate transistors 141), as shown in FIG. 13. Thus, the transfer gate transistors 141 formed by p-channel transistors connecting the sub bit lines and the main bit line with each other enter ON-states, thereby connecting the sub bit lines and the main bit line with each other.

A signal line ASS2 is similarly held at the step-down potential 0 V−α. Thus, the transfer gate transistor 119 connecting a node SNT of the sense amplifier 102 and the main bit line with each other enters an ON-state, thereby connecting the node SNT of the sense amplifier 102 and the main bit line with each other.

Signal lines PC1 and /PC2 are held at Vss (0 V). Thus, n-channel transistors 115c and 115d enter OFF-states and p-channel transistors 115e and 115f enter ON-states in the precharge portion 115, thereby precharging the SNB-side bit line, the main bit line and the sub bit lines to Vcc (1.8 V)

(Setup for Read Operation)

When the ferroelectric memory is accessed, the potential of the signal line /PC2 is stepped up from 0 V to Vcc, while the potentials of the signal line ASS1 of the selected subarray and the signal lines ASS1 (not shown) of the nonselected subarrays are stepped up from 0 V−α to Vcc. Thus, the transfer gate transistors 141 formed by p-channel transistors enter OFF-states, thereby cutting off all sub bit lines from the main bit line. Therefore, all sub bit lines are electrically separated from the main bit line. Thus, the sub bit lines enter floating states at Vcc.

At the same time, the potential of the signal line ASS2 is also stepped up from 0 V−α to Vcc. Thus, the transfer gate transistor 119 enters an OFF-state, thereby cutting off the node SNT of the sense amplifier 102 from the main bit line. Therefore, the main bit line enters a floating state at Vcc.

Then, the potential of the signal line PC1 is stepped up from 0 V to Vcc. Thus, the n-channel transistors 115c and 115d enter ON-states, thereby precharging the SNB-side bit line and the main bit line from Vcc to 0 V. After the main bit line is sufficiently precharged to 0 V, the potential of the signal line PC1 is stepped down from Vcc to 0 V. Therefore, the main bit line enters a floating state at 0 V. Then, the potential of the signal line PAS2 is stepped down from Vcc to 0 V. A reference potential generated in a reference potential generation circuit (not shown) is applied to an SNT-side bit line, so that the node SNT of the sense amplifier 102 reaches the reference potential. The reference potential is set to an intermediate level (about 1.3 V, for example) between a potential (about 1.8 V) output to the SNB-side bit line in an operation of reading low-level data described later and a potential (about 0.8 V) output to the SNB-side bit line in an operation of reading high-level data. On the other hand, the SNB-side bit line is connected to Vcc, thereby setting the potential of a node SNB of the sense amplifier 102 to Vcc. Thereafter the SNB-side bit line enters a floating state at Vcc.

(Read Operation)

In the read operation, the potential of a selected word line WL of the selected subarray is stepped down from Vcc to 0 V. Thus, a potential (read voltage) corresponding to data (low- or high-level data) written in the selected ferroelectric capacitor 133 appears on the sub bit line of the selected subarray. More specifically, Vcc—about 0.05 V (about 1.75 V) appears on the corresponding sub bit line when low-level data is written in the selected ferroelectric capacitor 133 while Vcc−about 0.15 V (about 1.65 V) appears on the corresponding sub bit line when high-level data is written in the ferroelectric capacitor 133, for example.

As hereinabove described, the threshold voltage of each potential amplification transistor 142 formed by a p-channel transistor is set to about −0.1 V. The potential of the signal line PAS1 is Vcc at this time, whereby source-to-gate potential difference Vgs of the potential amplification transistor 142 is about −0.05 V if the potential Vcc—about 0.05 V (about 1.75 V) corresponding to low-level data appears on the corresponding sub bit line. Therefore, the potential amplification transistor 142 remains in an OFF-state, thereby maintaining the potential of the main bit line at 0 V. If the potential Vcc—about 0.15 V (about 1.65 V) corresponding to high-level data appears on the sub bit line, on the other hand, the source-to-gate potential difference Vgs of the potential amplification transistor 142 is about −0.15 V. Therefore, the potential amplification transistor 142 enters an ON-state, whereby the potential of the main bit line is pulled by the potential (Vcc) of the signal line PAS1 and increased to about 0.5 V. In other words, the difference (about 0.5 V) between the potential (about 0 V) of the main bit line in the case of reading low-level data and the potential (about 0.5 V) of the main bit line in the case of reading high-level data is greater than the difference (about 0.1 V) between the potential Vcc—about 0.05 V (about 1.75 V) of the sub bit line in the case of reading low-level data and the potential Vcc—about 0.15 V (about 1.65 V) of the sub bit line in the case of reading high-level data according to the fifth embodiment, whereby this can be regarded as amplification of potential difference.

According to the fifth embodiment, the threshold voltage of the potential amplification transistor 118 formed by an n-channel transistor is set to about 0.25 V. The potential of the signal line PAS2 is 0 V, whereby source-to-gate potential difference Vgs of the potential amplification transistor 118 is about 0 V if the potential of the main bit line is maintained at about 0 V corresponding to low-level data. Therefore, the potential amplification transistor 118 remains in an OFF-state, thereby maintaining the potential of the SNB-side bit line at about 1.8 V. If the potential of about 0.5 V corresponding to high-level data appears on the main bit line, on the other hand, the source-to-gate potential difference Vgs of the potential amplification transistor 118 is about 0.5 V. Therefore, the potential amplification transistor 118 enters an ON-state, whereby the potential of the SNB-side bit line is pulled by the potential (0 V) of the signal line PAS2 and reduced from Vcc to about 0.8 V. In other words, the difference (about 1.0 V) between the potential (about 1.8 V) of the SNB-side bit line in the case of reading low-level data and the potential (about 0.8 V) of the SNB-side bit line in the case of reading high-level data is greater than the difference (about 0.5 V) between the potential (about 0 V) of the main bit line in the case of reading low-level data and the potential (about 0.5 V) of the main bit line in the case of reading high-level data, whereby this can be regarded as amplification of potential difference.

When the read voltage transmitted to the SNB-side bit line is further transmitted to the node SNB of the sense amplifier 102, the potential of a signal line SE is stepped up from 0 V to Vcc while the potential of a signal line /SE is stepped down from Vcc to 0 V. Thus, a p-channel transistor 123 of the sense amplifier 102 enters an ON-state, thereby supplying the voltage Vcc. An n-channel transistor 124 also enters an ON-state, thereby supplying the ground potential (0 V). Thus, the sense amplifier 102 is activated. The potential of the node SNB to which the potential (about 1.8 V or about 0.8 V) of the SNB-side bit line is transmitted and the potential of the node SNT to which the reference potential (about 1.3 V) is transmitted are differentially amplified, and data is read from the selected ferroelectric capacitor 133.

According to the fifth embodiment, the reversed-polarity node SNB of the sense amplifier 102 is connected to the first source/drain region of the potential amplification transistor 118 having the gate connected to the main bit line in the read operation so that the data of the main bit line and the data of the sense amplifier 102 are reversed to each other, dissimilarly to the aforementioned fourth embodiment. Thus, the sense amplifier 102 can read the same data as that (data having been written in a memory cell formed by the selected ferroelectric capacitor 133) of the sub bit line also when the data of the main bit line is reversed to the data of the sub bit line.

More specifically, the potentials of the nodes SNB and SNT are about 1.8 V and about 1.3 V respectively in the case of reading low-level data, for example, whereby the nodes SNB and SNT exhibit potentials of about 1.8 V and 0 V respectively after amplification in the sense amplifier 102. In the case of reading high-level data, on the other hand, the potentials of the nodes SNB and SNT are about 0.8 V and about 1.3 V respectively, whereby the nodes SNB and SNT exhibit potentials of 0 V and about 1.8 V respectively after amplification in the sense amplifier 102.

(Rewriting of Read Data)

Thereafter the read data is rewritten in the memory cell formed by the selected ferroelectric capacitor 133. First, the potential of the signal line ASS2 is stepped down from Vcc to the step-down potential 0 V−α. Thus, the transfer gate transistor 119 enters an ON-state, thereby electrically connecting the node SNT of the sense amplifier 102 and the main bit line with each other. The potential of the signal line ASS1 of the selected subarray is stepped down from Vcc to the step-down potential 0 V−α. Thus, the transfer gate transistor 141 enters an ON-state, thereby electrically connecting the main bit line and the selected sub bit line with each other. Therefore, the potential (rewrite potential) of the node SNT is transmitted to the selected sub bit line through the main bit line.

According to the fifth embodiment, the main bit line is connected to the node SNT of the same polarity side in the rewrite operation, dissimilarly to the read operation. Thus, the same data as the read data is written in the memory cell formed by the selected ferroelectric capacitor 133 through the corresponding sub bit line.

At this time, the potential of the signal line PAS1 is stepped down from Vcc to 0 V. Thus, the potential amplification transistor 142 can be inhibited from causing potential difference exceeding the threshold voltage between the source and the gate thereof also when the potential of the corresponding sub bit line connected to the gate of the potential amplification transistor 142 formed by a p-channel transistor is set to 0 V, to be inhibited from entering an ON-state in the rewrite operation.

At the same time, the potential of the signal line PAS2 is stepped down from 0 V to Vcc. Thus, the potential amplification transistor 118 can be inhibited from causing potential difference exceeding the threshold voltage between the source and the gate thereof also when the potential of the main bit line connected to the gate of the potential amplification transistor 118 formed by an n-channel transistor is set to 0 V, to be inhibited from entering an ON-state in the rewrite operation.

In order to rewrite high-level data, Vcc is transmitted from the node SNT to the selected sub bit line while the potential of the selected word line WL is set to 0 V. Thus, the high-level data is rewritten in the selected ferroelectric capacitor 133. Thereafter the potential of the selected word line WL is stepped up from 0 V to Vcc. In order to rewrite low-level data, on the other hand, 0 V is transmitted from the node SNT to the selected sub bit line while the potential of the selected word line WL is set to Vcc. Thus, the low-level data is rewritten in the selected ferroelectric capacitor 133. Thereafter the potential of the signal line SE is stepped down from Vcc to 0 V while the potential of the signal line /SE is stepped up from 0 V to Vcc. Further, the potential of the signal line PAS1 is stepped up from 0 V to Vcc, while the potential of the signal line /PC2 is stepped down from Vcc to 0 V. Thus, the ferroelectric memory returns to a standby state.

The remaining effects of the fifth embodiment are similar to those of the aforementioned fourth embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while each of the aforementioned embodiments is applied to the simple matrix ferroelectric memory, the present invention is not restricted to this but is also applicable to another memory, other than the simple matrix ferroelectric memory, having a bit line hierarchical structure.

While the memory cell array is divided into six subarrays in each of the aforementioned first, second and third embodiments, the present invention is not restricted to this but the memory cell array may alternatively be divided into at least two subarrays.

While the data read operation and the rewrite operation are described in relation to each of the aforementioned first and second embodiments, a data write operation is performed by a method similar to that for the rewrite operation.

While the threshold voltage of each potential amplification transistor 32 formed by an n-channel transistor is set to about 0.1 V in the aforementioned first embodiment and the threshold voltage of each potential amplification transistor 42 formed by a p-channel transistor is set to about −0.1 V in the aforementioned second embodiment so that the potential amplification transistors 32 and 42 completely enter OFF-states in the case of reading low-level data, the present invention is not restricted to this but the threshold voltage of each potential amplification transistor formed by an n-channel transistor may alternatively be reduced or the threshold voltage of each potential amplification transistor formed by a p-channel transistor may alternatively be increased to be improved in drivability in an ON-state (in the case of reading high-level data). In this case, the potential amplification transistor enters a weak ON-state when low-level data is read.

According to this structure, the speed for changing the potential of the main bit line in the case of reading high-level data can be improved. If the threshold voltage of the potential amplification transistor formed by an n-channel transistor is excessively reduced or that of the potential amplification transistor formed by a p-channel transistor is excessively increased, however, the ON-state of the potential amplification transistor in the case of reading low-level data is so strong that there is no difference between the same and the ON-state of the potential amplification transistor in the case of reading high-level data, to result in difficulty with potential amplification. In consideration of this point, the inventor has made simulated calculations, to prove that the threshold voltage of the potential amplification transistor formed by an n-channel transistor is preferably set to about 0.1 V to about −0.2 V and the threshold voltage of the potential amplification transistor formed by a p-channel transistor is preferably set to about −0.1 V to about 0.2 V.

While the transistors for connecting the main bit line and the sub bit lines with each other, those for connecting the sub bit lines with each other and those for connecting the sub bit lines to the ground wires are formed by n-channel transistors in the aforementioned third embodiment, the present invention is not restricted to this but these transistors may alternatively be formed by p-channel transistors.

What is claimed is:

1. A memory comprising:
   a memory cell array including a plurality of subarrays;
   a word line arranged on the memory cell array;
   a main bit line arranged to intersect with the word line;
   a sub bit line arranged on each of the subarrays and configured to be connectable to the main bit line;
   a storage portion connected between the word line and the sub bit line; and
   a first transistor having a gate connected to the sub bit line, a first source/drain region connected to the main bit line and configured to control a potential of the main bit line during a read operation based on a potential of the sub bit line, and a second source/drain region configured to be connected to a reference higher than ground fixed voltage to maintain the first transistor in an OFF-state during a write operation to the storage portion.

2. The memory of claim 1, wherein the first transistor has a threshold voltage such that:
   the first transistor is configured to enter an ON-state, during the read operation and through a first potential appearing on the sub bit line, if first data has been stored in the storage portion; and
   the first transistor is configured to enter an OFF-state or a weaker ON-state than the ON-state, during the read operation and through a second potential appearing on the sub bit line, if second data has been stored in the storage portion.

3. The memory of claim 2, further comprising a signal line connected to the second source/drain region of the first transistor, wherein the memory is configured to set a potential of the signal line such that a difference between the potentials of the signal line and the main bit line is greater than a difference between the first potential of the sub bit line and the second potential of the sub bit line.

4. The memory of claim 3, wherein the memory is further configured to set the potential of the signal line to a level sufficient to turn off the first transistor during the write operation.

5. The memory of claim 1, further comprising a second transistor having a first source/drain region connected to the sub bit line and a second source/drain region connected to the main bit line, wherein the second transistor is configured to be in an OFF-state during the read operation and in an ON-state during the write operation.

6. The memory of claim 1, further comprising a third transistor arranged between respective sub bit lines and configured to connect the respective sub bit lines with each other, wherein the memory is configured to connect a sub bit line of a nonselected one of the subarrays to a fixed potential through the third transistor at least during the read operation.

7. The memory of claim 1, further comprising an inversion portion configured to write data reversed in polarity to data read from the storage portion, onto the main bit line in a memory cell of the memory cell array.

8. The memory of claim 1, further comprising:
a sense amplifier; and
a fourth transistor having a gate connected to the main bit line and a first source/drain region connected to a node of the sense amplifier, and configured to control a potential of the node based on the potential of the main bit line during the read operation.

9. The memory of claim 8, wherein at least either the first transistor or the fourth transistor is configured to amplify a potential.

10. The memory of claim 8, wherein the first transistor has a threshold voltage such that:
the first transistor is configured to enter an ON-state, during the read operation and through a first potential appearing on the sub bit line, if first data has been stored in the storage portion; and
the first transistor is configured to enter an OFF-state or a weaker ON-state than the ON-state, during the read operation and through a second potential appearing on the sub bit line, if second data has been stored in the storage portion.

11. The memory of claim 8, further comprising a signal line connected to the second source/drain region of the first transistor, wherein the memory is configured to set a potential of the signal line such that a difference between the potentials of the signal line and the main bit line is greater than a difference between the first potential of the sub bit line and the second potential of the sub bit line.

12. The memory of claim 11, wherein the memory is further configured to set the potential of the signal line to a level sufficient to turn off the first transistor during the write operation.

13. The memory of claim 8, further comprising a fifth transistor having a first source/drain region connected to the sub bit line and a second source/drain region connected to the main bit line, wherein the fifth transistor is configured to be in an OFF-state during the read operation and in an ON-state during the write operation.

14. The memory of claim 1, wherein the storage portion comprises a ferroelectric capacitor.

15. The memory of claim 14, wherein the ferroelectric capacitor comprises a simple matrix ferroelectric capacitor connected to both the word line and the sub bit line.

16. The memory of claim 1, further comprising a sense amplifier connected to the main bit line and configured to amplify a read voltage from a memory cell in the memory cell array.

17. The memory of claim 1, further comprising a precharge portion connected to the main bit line and configured to precharge both the main bit line and the sub bit line.

18. A memory, comprising:
a main bit line;
a sub bit line connectable to the main bit line;
first terminal means of a first transistor for connecting the first transistor to the main bit line to control, during a read operation, a potential of the main bit line based on a potential of the sub bit line; and
second terminal means of the first transistor for connecting the first transistor to a first voltage higher than ground to maintain, during both high level data and low level data write operations, the first transistor in an OFF-state.

19. The memory of claim 18, wherein:
the first transistor is configured to enter an ON-state, during the read operation and through a first potential appearing on the sub bit line, if first data has been stored; and
the first transistor is configured to enter an OFF-state or a weaker ON-state than the ON-state, during the read operation and through a second potential appearing on the sub bit line, if second data has been stored.

* * * * *

UNITED STATES PATENT AND TRADEMARK OFFICE
CERTIFICATE OF CORRECTION

PATENT NO. : 7,733,681 B2
APPLICATION NO. : 11/739336
DATED : June 8, 2010
INVENTOR(S) : Hideaki Miyamoto It is certified that error appears in the above-identified patent and that said Letters Patent is hereby corrected as shown below:

Column 26, lines 40-41, "reference higher than ground fixed voltage to" should read --reference fixed voltage higher than ground to--.

Signed and Sealed this
Twenty-first Day of June, 2011

David J. Kappos
*Director of the United States Patent and Trademark Office*